United States Patent
Wu et al.

(10) Patent No.: US 12,041,771 B2
(45) Date of Patent: Jul. 16, 2024

(54) POLYSILICON REMOVAL IN WORD LINE CONTACT REGION OF MEMORY DEVICES

(71) Applicant: Taiwan Semiconductor Manufacturing Co., Ltd., Hsinchu (TW)

(72) Inventors: Yen-Jou Wu, Hsinchu (TW); Chih-Ming Lee, Tainan (TW); Keng-Ying Liao, Tainan (TW); Ping-Pang Hsieh, Tainan (TW); Su-Yu Yeh, Tainan (TW); Hsin-Hui Lin, Hsinchu (TW); Yu-Liang Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/815,043

(22) Filed: Jul. 26, 2022

(65) Prior Publication Data

US 2022/0367495 A1 Nov. 17, 2022

Related U.S. Application Data

(62) Division of application No. 16/916,959, filed on Jun. 30, 2020, now Pat. No. 11,527,543.

(51) Int. Cl.
*H01L 29/788* (2006.01)
*G11C 8/14* (2006.01)
(Continued)

(52) U.S. Cl.
CPC ............. *H10B 41/35* (2023.02); *G11C 8/14* (2013.01); *H01L 29/42324* (2013.01);
(Continued)

(58) Field of Classification Search
CPC ......... H01L 27/11524; H01L 27/11519; H01L 29/42324; H01L 29/66825; H01L 29/788;
(Continued)

(56) References Cited

U.S. PATENT DOCUMENTS 8,043,951 B2 10/2011 Beugin et al.
8,513,728 B2 8/2013 Ghazavi et al.
(Continued)

FOREIGN PATENT DOCUMENTS

CN 104335334 2/2015
CN 110323217 A 10/2019
(Continued)

OTHER PUBLICATIONS

Chinese Office Action directed to Chinese Patent Application No. 202110501268.3, mailed Mar. 27, 2024; 8 pages.

*Primary Examiner* — Shahed Ahmed
(74) *Attorney, Agent, or Firm* — Sterne, Kessler, Goldstein & Fox P.L.L.C.

(57) ABSTRACT

The present disclosure describes a patterning process for a strap region in a memory cell for the removal of material between polysilicon lines. The patterning process includes depositing a first hard mask layer in a divot formed on a top portion of a polysilicon layer interposed between a first polysilicon gate structure and a second polysilicon gate; depositing a second hard mask layer on the first hard mask layer. The patterning process also includes performing a first etch to remove the second hard mask layer and a portion of the second hard mask layer from the divot; performing a second etch to remove the second hard mask layer from the divot; and performing a third etch to remove the polysilicon layer not covered by the first and second hard mask layers to form a separation between the first polysilicon gate structure and the second polysilicon structure.

20 Claims, 22 Drawing Sheets

(51) Int. Cl.
  *H01L 29/423* (2006.01)
  *H01L 29/66* (2006.01)
  *H10B 41/10* (2023.01)
  *H10B 41/35* (2023.01)

(52) U.S. Cl.
  CPC ...... *H01L 29/66825* (2013.01); *H01L 29/788* (2013.01); *H10B 41/10* (2023.02)

(58) Field of Classification Search
  CPC ......... H01L 27/11521; H01L 27/11565; H01L 29/40114; H01L 29/42328; H01L 27/11568; H01L 27/11517–1156; G11C 8/14; G11C 16/0408–0458; G11C 11/5621–5642; G11C 2216/06–10; H10B 41/35; H10B 41/10; H10B 41/30; H10B 43/10; H10B 43/30; H10B 41/00–70
  See application file for complete search history.

(56) References Cited

U.S. PATENT DOCUMENTS

| | | | |
|---|---|---|---|
| 9,735,157 B1* | 8/2017 | Chun | ................. H01L 27/0886 |
| 10,325,918 B2 | 6/2019 | Wu et al. | |
| 11,127,827 B2 | 9/2021 | Hsu et al. | |
| 11,217,582 B2 | 1/2022 | Hafez et al. | |
| 11,527,543 B2 | 12/2022 | Wu et al. | |
| 2004/0026763 A1 | 2/2004 | Ma et al. | |
| 2004/0227245 A1* | 11/2004 | Ding | ................. H01L 21/76897 |
| | | | 257/E21.507 |
| 2005/0032306 A1* | 2/2005 | Ding | ..................... H10B 41/49 |
| | | | 438/257 |
| 2005/0170578 A1 | 8/2005 | Hsiao et al. | |
| 2007/0093024 A1 | 4/2007 | Fu et al. | |
| 2008/0012055 A1 | 1/2008 | Kim et al. | |
| 2010/0207213 A1* | 8/2010 | Tan | ....................... H01L 21/743 |
| | | | 438/151 |
| 2015/0076669 A1 | 3/2015 | Chang et al. | |
| 2015/0255473 A1 | 9/2015 | Hong | |
| 2016/0365350 A1* | 12/2016 | Chuang | ............. H01L 21/32139 |
| 2018/0190537 A1 | 7/2018 | Li et al. | |
| 2018/0233509 A1 | 8/2018 | Cai et al. | |
| 2018/0315764 A1 | 11/2018 | Yang et al. | |
| 2019/0139779 A1 | 5/2019 | Karakas et al. | |
| 2019/0229123 A1 | 7/2019 | Tsao et al. | |
| 2020/0075404 A1 | 3/2020 | Huang et al. | |
| 2020/0098877 A1 | 3/2020 | Hsu et al. | |
| 2020/0105346 A1 | 4/2020 | Yang et al. | |
| 2020/0161317 A1 | 5/2020 | Yang et al. | |

FOREIGN PATENT DOCUMENTS

| | | |
|---|---|---|
| DE | 10 2019 101 676 A1 | 3/2020 |
| KR | 20000044895 | 7/2000 |
| KR | 20040033774 | 4/2004 |
| KR | 10-20100049573 A | 5/2010 |
| KR | 10-20180060911 A | 6/2018 |
| TW | 201832238 A | 9/2018 |

* cited by examiner

300

```
┌─────────────────────────────────────────────────────┐
│ Forming an oxide layer and a nitride layer on adjacent │ ~ 310
│ gate structures separated by a polysilicon layer    │
└─────────────────────────────────────────────────────┘
                          ▼
┌─────────────────────────────────────────────────────┐
│ Form a patterned photoresist layer on the nitride layer │ ~ 320
└─────────────────────────────────────────────────────┘
                          ▼
┌─────────────────────────────────────────────────────┐
│ Etch the photoresist layer to form an opening to    │
│ expose a portion of the nitride layer over the      │ ~ 330
│ polysilicon layer                                   │
└─────────────────────────────────────────────────────┘
                          ▼
┌─────────────────────────────────────────────────────┐
│ Remove, through the opening, the exposed portion of │
│ the nitride layer and the underlying oxide layer to │ ~ 340
│ expose the polysilicon layer                        │
└─────────────────────────────────────────────────────┘
                          ▼
┌─────────────────────────────────────────────────────┐
│ Etch the exposed polysilicon layer to form a        │
│ separation or spacing between the adjacent gate     │ ~ 350
│ structures                                          │
└─────────────────────────────────────────────────────┘
```

FIG. 3

POLYSILICON REMOVAL IN WORD LINE CONTACT REGION OF MEMORY DEVICES

CROSS-REFERENCE TO RELATED APPLICATION

This application is a divisional of U.S. Non-Provisional patent application Ser. No. 16/916,959, filed on Jun. 30, 2020, titled "Polysilicon Removal in Word Line Contact Region of Memory Devices," which is incorporated by reference herein in its entirety.

BACKGROUND

Non-volatile memory devices, such as flash memory, are used in a wide range of electronic devices or instruments (e.g., computers, cell phones, tablets, digital cameras, scientific instruments, etc.) to store data and/or programming instructions that can be subsequently read, erased, programmed, and saved When power is removed. Non-volatile memory (NVM) cells are thus an important component of modern chips.

BRIEF DESCRIPTION OF THE DRAWINGS

Aspects of the present disclosure are best understood from the following detailed description when read with the accompanying figures.

FIG. 3 is a flow-chart of a patterning method for the removal of polysilicon material in a strap region of a memory cell, in accordance with some embodiments FIG. 4 a cross-sectional view of an intermediate structure during a patterning method for the removal of polysilicon material in a strap region of a memory cell, in accordance with some embodiments.

DETAILED DESCRIPTION

Figure 1A:
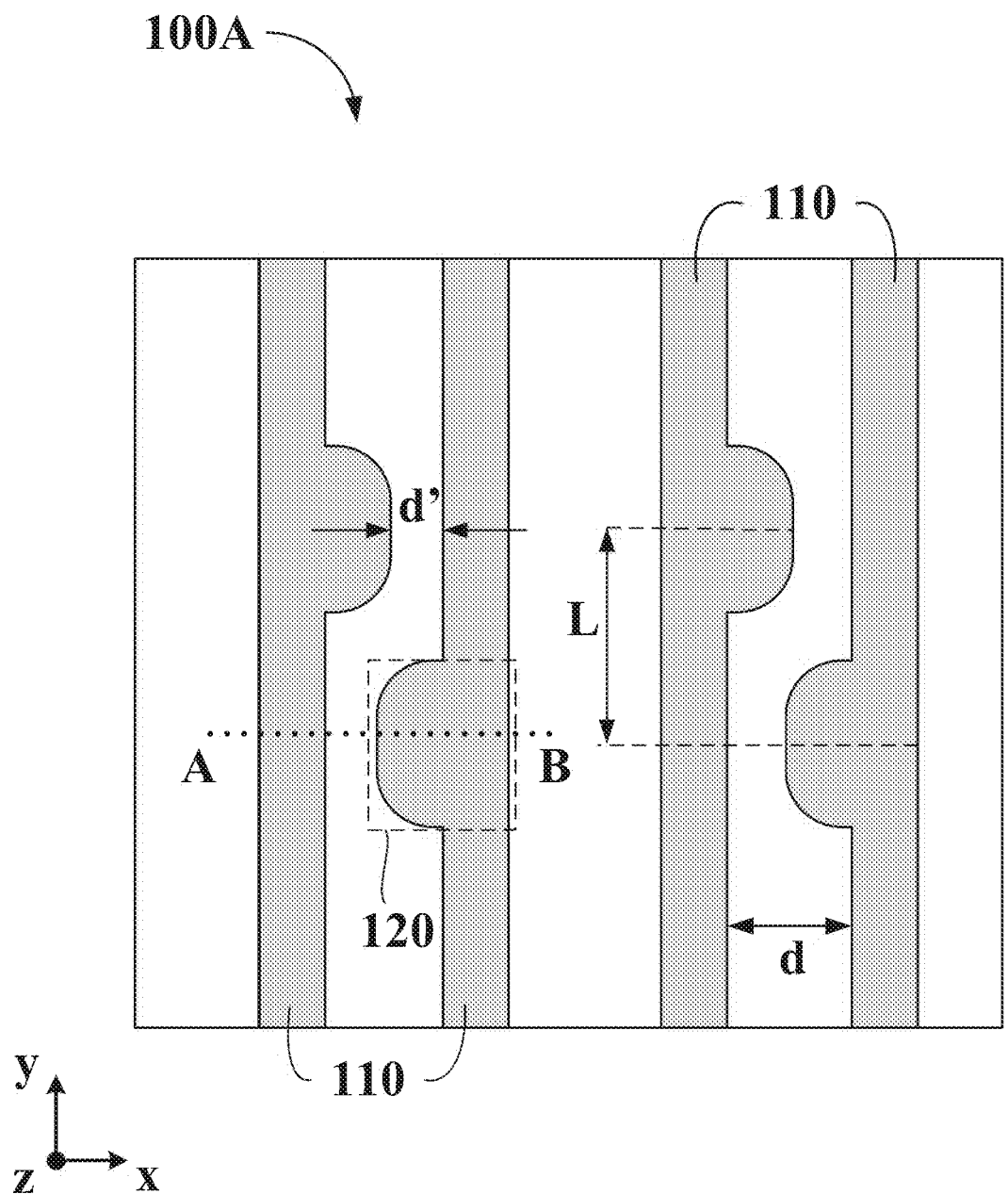
FIGS. 1A and 1B are top views of polysilicon lines in a strap region of a memory cell, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes and/or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Flash memory is a type of non-volatile memory that stores information in an array of memory cells made from floating-gate transistors. Each memory cell resembles a metal-oxide-semiconductor field-effect transistor (MOSFET) except that the transistor has two gates instead of one. The memory cells operate as an electrical switch in which current flows between two terminals (e.g., a source and a drain) and is controlled by a floating gate (FG) and a control gate (CG)

made of polysilicon. The CG is similar to the gate in other MOS transistors, but below it, there is the FG insulated all around by an oxide layer. The FG is interposed between the CG and the MOSFET channel. Because the FG is electrically isolated by its insulating layer, electrons placed on it are trapped. When the FG is charged with electrons, this charge screens the electric field from the CG, thus increasing the threshold voltage (VT1) of the memory cell. If there is charge present in the FG, a higher voltage (VT2) must be applied to the CG to make the channel conductive. In order to read a value from the transistor, an intermediate voltage between the threshold voltages (VT1 & VT2) is applied to the CG. If the channel conducts at this intermediate voltage, the FG is considered uncharged because if it was charged, there would be no current flow in the channel between the source and the drain terminals. In this situation, a logical "1" can be interpreted from this condition of the FG. If the channel does not conduct at the intermediate voltage, this situation indicates that the FG is charged; here, a logical "0" can be interpreted from this condition of the FG. The presence of charge on the FG is "sensed" by determining whether there is current flowing through the transistor when the intermediate voltage is applied on the CG. In a multi-level cell device, which stores more than one bit per cell, the amount of current flow can be sensed (versus simply determining whether the presence or absence of current flow), in order to determine more precisely the level of charge on the FG.

Within the flash memory cell area, the transistor gates are formed as densely packed lines referred to as polysilicon lines. The polysilicon lines are parallel to one another and are separated by a spacing. Voltage application to the CG portion of the polysilicon lines is achieved via contacts formed on areas of the CG polysilicon lines that act as contact landing pads. These contact landing pads are wider than the rest of the polysilicon line to facilitate the formation of the contact and are referred to as "contact regions" or "strap regions." It is at the strap locations where the spacing is the narrowest between two neighboring polysilicon lines, according to some embodiments.

With each technology generation (node), the spacing between adjacent polysilicon lines decreases to increase the density of the memory cell and to improve the memory device's storage capacity. As a result, the area between neighboring polysilicon lines becomes increasingly challenging to pattern—e.g., selectively remove any deposited material (e.g., polysilicon). This is critical for the strap regions where the polysilicon line spacing between neighboring tines is the narrowest. Residue left behind between the tightly packed polysilicon lines can cause "bridging," which can result in electrical shorts.

To address the aforementioned shortcomings, this disclosure is directed to a patterning process that removes excess material between polysilicon lines in the vicinity of the strap regions of memory cells and reduces (or eliminates) residue left behind by the removal process. In some embodiments, the residue reduction (or elimination) is accomplished by photolithography and etching operations that facilitate the removal process of excess material between tightly spaced adjacent polysilicon lines.

Figure 1B:
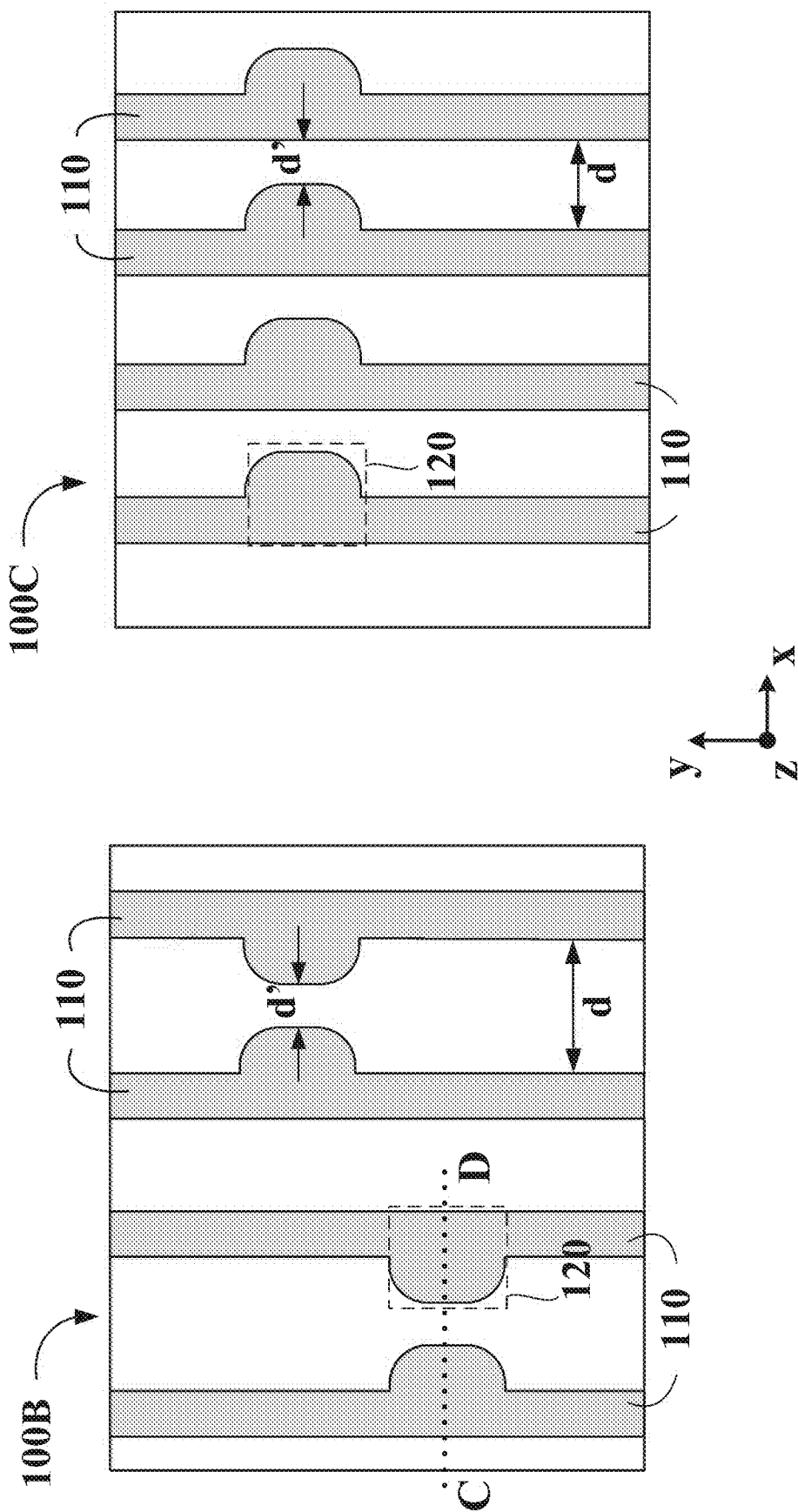

FIG. 1A is a partial top view of a memory cell (e.g., a flash memory cell) 100A where polysilicon lines 110 are formed parallel to each other at a nominal spacing d. Polysilicon lines 1110 feature wider portions (e.g., strap regions or contact regions 120) to facilitate the formation of contacts not shown in FIG. 1A. In some embodiments, the spacing between adjacent polysilicon lines in the vicinity of contact regions 120 is reduced from d to d'. in some embodiments, d' is the minimum spacing between two neighboring polysilicon lines 110. In some embodiments, contact regions 120 are intentionally offset in the y-direction to allow tighter spacing d between adjacent polysilicon lines 110 as shown in FIG. 1. Further, this design allows the formed contacts to be adequately separated to avoid bridging between the contacts. The layout of memory cell 100 is not limited to the depiction of FIG. 1, and alternative layouts are possible. For example, contact regions 120 from adjacent polysilicon lines 110 can be formed with no y-direction offset as shown in FIG. 1B for memory cells 100B and 100C. The layouts shown in FIG. 1B are within the spirit and the scope of this disclosure and the embodiments described herein are equally applicable to layouts 100A, 100B, and 100C, or variations thereof.

Each polysilicon line 110 represents a gate stack structure that is shared among several transistors formed within a flash cell. Further, each polysilicon line 110 includes a CG and a FG structure not shown in FIGS. 1A and 1B. Both the CG and FG structures are made of polysilicon and are positioned parallel to each other. As shown in FIGS. 1A and 1B, polysilicon lines extend lengthwise along the y-direction. Only selective components of memory cells 100A-C are shown in FIGS. 1A and 1B and other components, features, or layers are not shown for simplicity. These other layers include, but are not limited, to isolation regions, capping layers, spacers, additional polysilicon features (e.g., erase gates), doped regions, dielectric layers, contacts, etc. These other components, features, or layers are within the spirit and the scope of this disclosure.

In some embodiments, spacing d ranges between about 400 nm and 500 nm while spacing d' ranges between about 200 nm and about 300 nm depending on the cell layout. The aforementioned ranges are not limiting and other values or ranges for spacing d and d' are possible. These other values or ranges are within the spirit and the scope of this disclosure. In some embodiments, spacing d and d' are governed by design rules set by a particular technology node. In referring to FIG. 1A, contact regions 120 of polysilicon lines 110 are offset in the y-direction by distance L, which is larger than spacing d'. By way of example and not limitation, distance L can be about 600 nm. Gate contacts are formed on polysilicon lines 110 within the designated contact regions 120. Each gate contact allows simultaneous control of multiple transistor gates. In other words, several gate structures can be "strapped" together and controlled with the same signal. Contact regions 120 may also be referred to as "strap" or "strap location." In some embodiments, the contacts formed in contact regions 120 provide, for example, a word line electrical signal to the CG of the transistor.

Figure 2A:
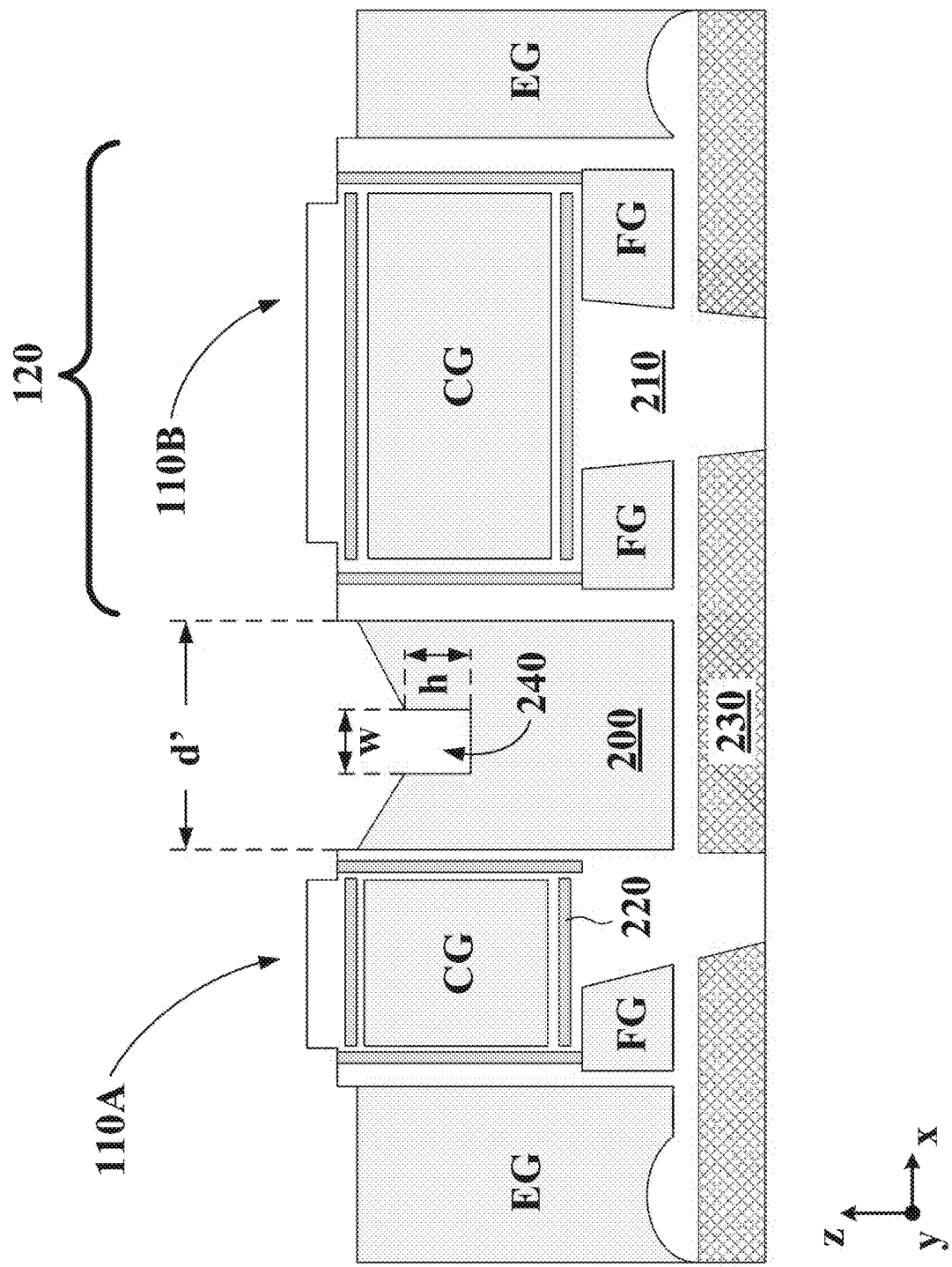
FIG. 2A is a cross-sectional view of polysilicon lines in a strap region of a memory cell, in accordance with some embodiments.
Figure 2B:
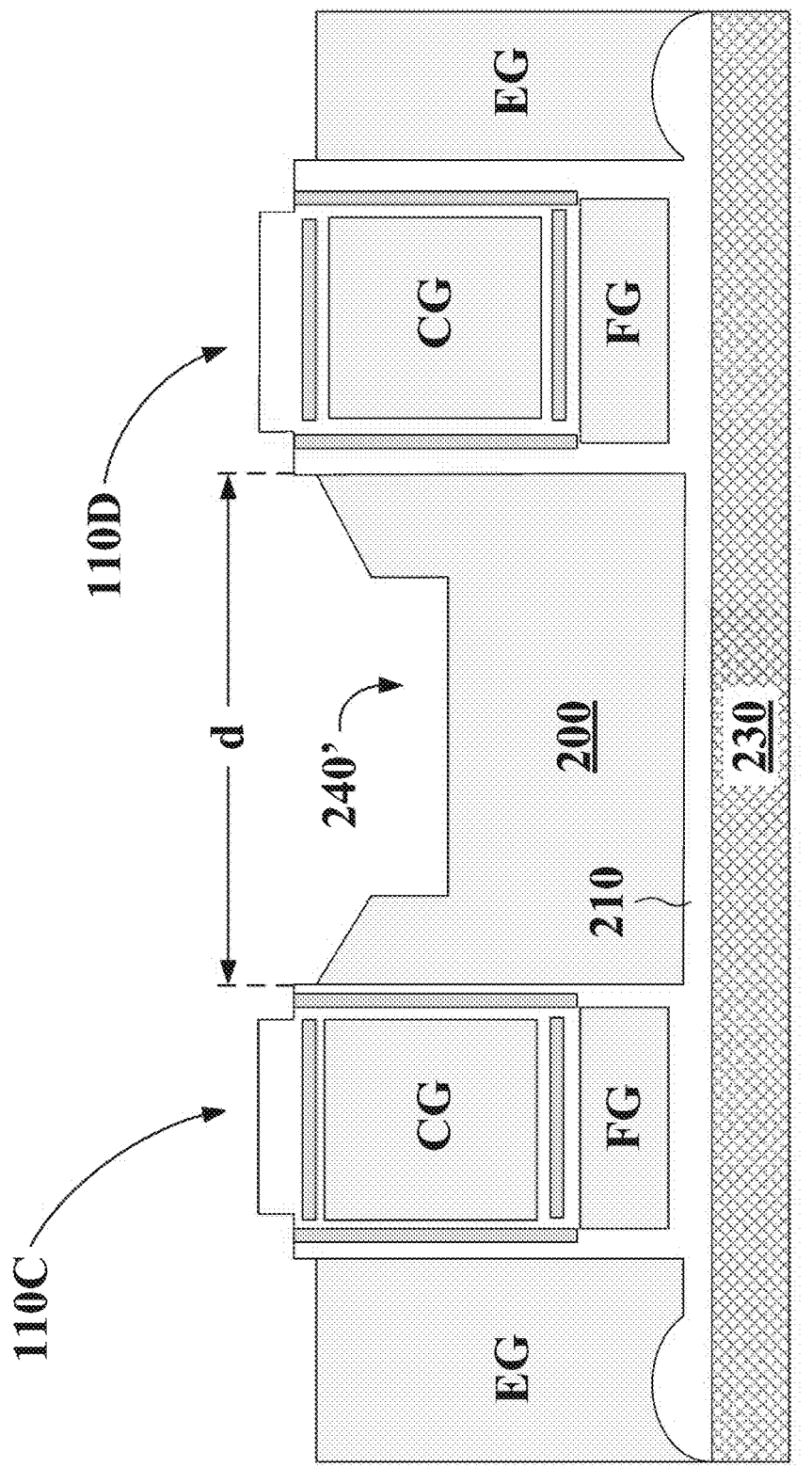
FIG. 2B is a cross-sectional view of polysilicon lines in an area of a memory cell outside a strap region, in accordance with some embodiments.

By way of example and not limitation, FIG. 2A is a cross-sectional view of two neighboring polysilicon lines/gate structures 110A and 110B. In some embodiments, FIG. 2A is a cross-sectional view of FIG. 1A along cut line A-B prior to the formation of a CG contact on gate structure 110B. As discussed above with respect to FIG. 1, in the vicinity of contact region 120, one of the polysilicon lines/gate structures is wider than the other. In the example of FIG. 2A, gate structure 110B is wider than gate structure 110A because FIG. 2A is a cross-sectional view along contact region 120 of gate structure 110B. Each gate structure includes a CG and one or more FGs isolated via a dielectric layer 210. Further, each CG in gate structures 110A and 110B is isolated via nitride layers 220. By way of example and not limitation, nitride layers 220 can include silicon nitride, and dielectric layer 210 can include silicon oxide. In some embodiments, gate structures 110A and 110B are formed on semiconductor substrate 230 as shown in FIG. 2A. In other embodiments, gate structures 110A and 110B are formed on isolation regions, such as shallow trench isolation regions. In some embodiments, gate structures formed in areas outside contact region 120 (e.g., outside the strap region and within the memory cell) can look different than gate structure 110A or 110B. For example, such gate structures may feature a single FG that extends along the entire width of the CG in the x-direction as shown in FIG. 2B for gate structures 110C and 110D.

In referring to FIG. 2A, gate structures 110A and 110B are separated by a polysilicon layer 200, which laterally fills the space between "internal" sidewall surfaces of gate structures 110A and 110B. Due to spacing d' between gate structures 110A and 110B, polysilicon layer 200 features a divot 240 having a width w between about 30 nm and about 50 nm, and a height h between about 50 nm and about 70 nm. In some embodiments, the aspect ratio of divot 240 depends on spacing d' between gate structures 110A and 110B. For example, as spacing d' decreases (e.g., d'«d), the aspect ratio of divot 240 increases. Conversely, as spacing d' increases (e.g., d'≈d), the aspect ratio of the divot decreases (e.g., the aspect ratio can be less than about 1) as shown for divot 240' in FIG. 2B where the spacing between adjacent gate structures 110C and 110D is equal to d. in some embodiments, the aspect ratio (h/w) of divot 240 shown in FIG. 2A (e.g., in the vicinity of contact region 120), ranges between about 2.3 and about 1. In some embodiments, divot 240' shown in FIG. 2B (e.g., outside contact region 120) is wider (e.g., wider than about 50 nm) with a less aggressive aspect ratio than divot 240 (e.g., with an aspect ratio less than about 1).

In addition, erase gates (EG) structures are formed on "outside" sidewall surfaces of gate structures 110A and 110B. EG structures are formed from polysilicon, similar to the CG and FG as discussed above. In some embodiments, polysilicon layer 200 is subsequently etched to form a separation within spacing d'.

Figure 2C:
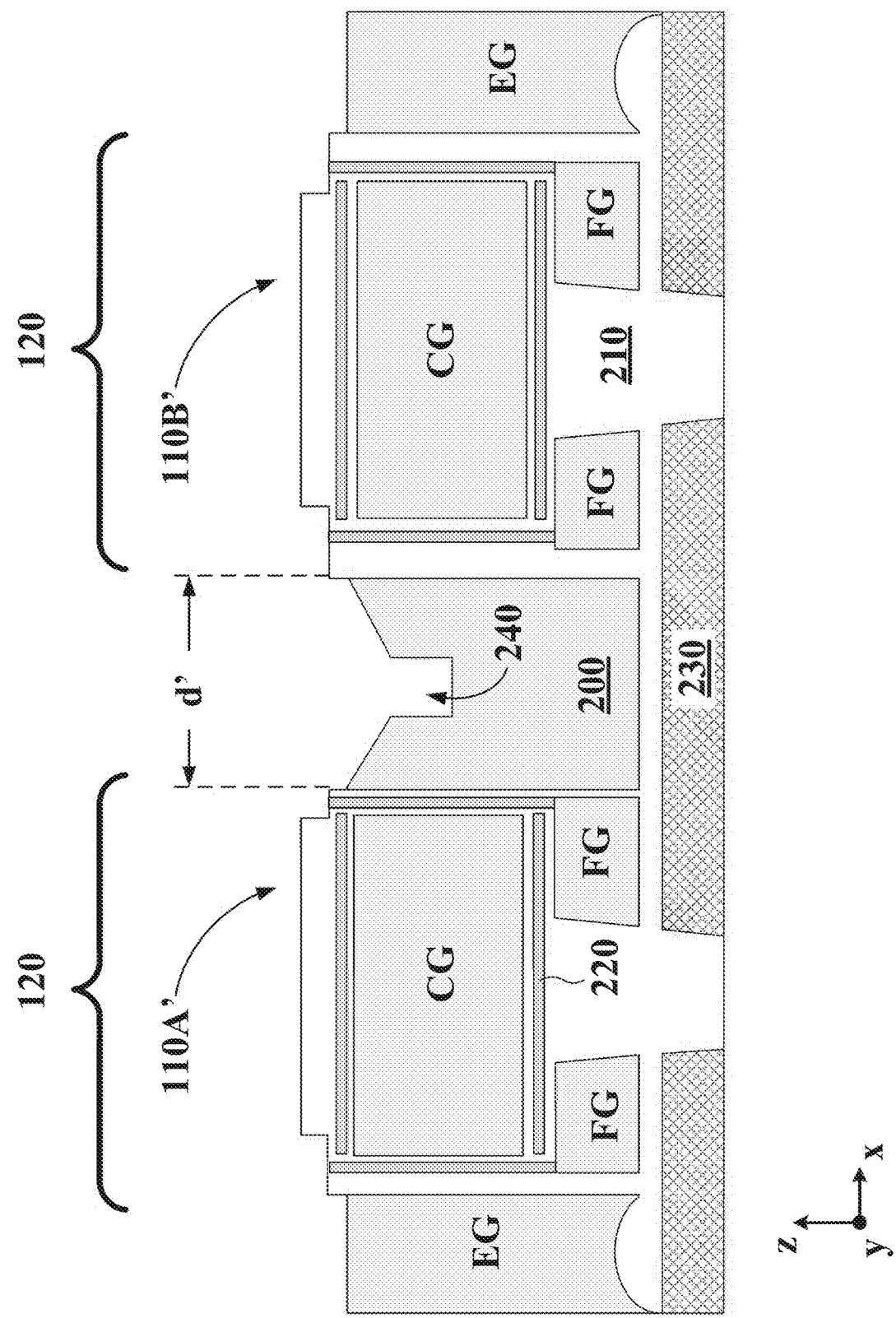
FIG. 2C is a cross-sectional view of polysilicon lines in a strap region of a memory cell, in accordance with some embodiments.

In some embodiments, FIG. 2C is a cross-sectional view of gate structures 110A' and 110B' of memory cell 100B shown in FIG. 1B along cut line C-D. Due to the layout differences between memory cells 100B and 100A, the cross-sectional view of FIG. 2C looks different from that of FIG. 2A with respect to gate structures 110A' and 100B'. For example, cut line C-D traverses through contact region 120 of both gate structures 110A' and 110B'; therefore, at the location of cut-line C-D gate structures 110A' and 110B' have substantially equal widths along the x-direction. In FIG. 2C, similar to FIG. 2A, polysilicon layer 200 disposed between gate structures 110A' and 110B' features a divot 240 due to spacing d' as discussed above.

In some embodiments, a cross sectional view for memory cell 100C along contact regions 120 of adjacent polysilicon lines 110 would look similar to FIG. 2C.

in some embodiments, FIG. 2A and FIG. 2C are precursor structures (e.g., starting structures) for the embodiments described herein, which can be equally applied to memory cell layouts 100A/B/C and their variants thereof For simplicity and without departing from the spirit and the scope of the disclosure, the embodiments described herein will be described with respect to memory cell 100A.

FIG. 3 is a flow chart of a fabrication method 300 describing a patterning process in the vicinity of contact region 120 between gate structures 110A and 110B shown in FIG. 1A according to some embodiments. Other fabrication operations may be performed between the various operations of method 300 and may be omitted merely for clarity and ease of description. These various operations are within the spirit and the scope of this disclosure. Additionally, not all operations may be required to perform the disclosure provided herein. Some of the operations may be performed simultaneously, or in a different order than the ones shown in FIG. 3. In some embodiments, one or more other operations may be performed in addition to or in place of the presently described operations. Method 300 will be described in reference to FIGS. 4A through 9C.

In referring to FIG. 3, method 300 begins with operation 310 and the process of forming an oxide and a nitride layer on gate structures separated by a polysilicon layer, such as gate structures 110A and 110B separated by polysilicon layer 200 shown in FIG. 2A. In some embodiments, the oxide layer is formed followed by the nitride layer. The oxide and nitride layers collectively form a hard mask stack that facilitates the patterning process of polysilicon layer 200. By way of example and not limitation, oxide layer 400 can be silicon oxide ($SiO_2$) thermally grown at about 680° C. to a thickness between about 30 nm and about 40 nm. Nitride layer 410 can include silicon nitride ($Si_3N_4$), or silicon oxynitride (SiON) grown at about 400° C. and at a thickness between about 10 nm and 20 nm. In some embodiments, nitride layer 410 is deposited with a substantially conformal process, such as a chemical vapor deposition process (CVD). The aforementioned materials, thicknesses, and growth conditions are not limiting and other materials, thicknesses, and growth conditions are possible. These other materials, thicknesses, and growth conditions are within the spirit and the scope of this disclosure.

Figure 4:
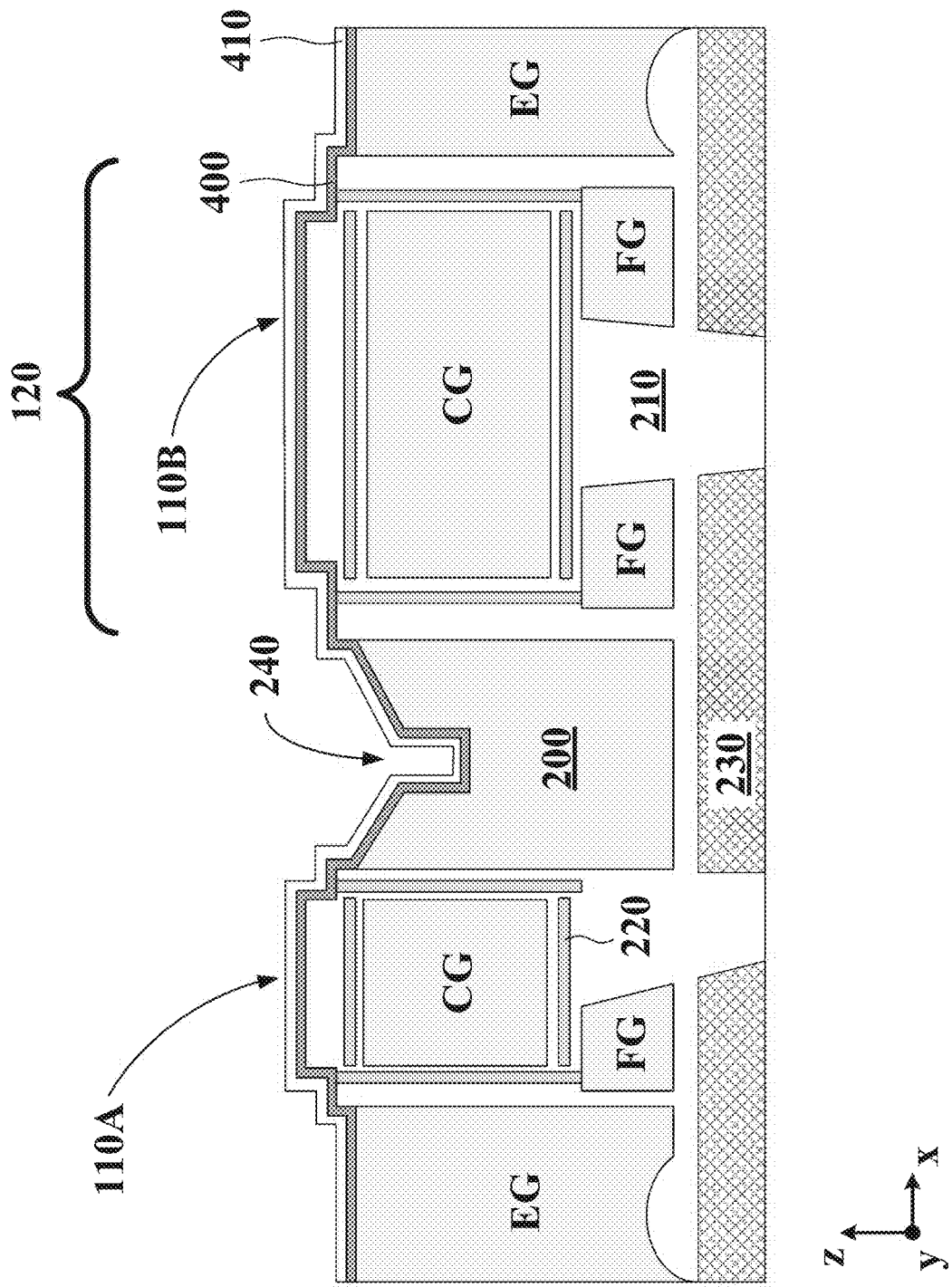

FIG. 4 shows gate structures 110A and 110B after the deposition of oxide layer 400 and nitride layer 410 according to operation 310, according to some embodiments. In some embodiments, oxide layer 400 and nitride layer 410 cover the sidewall and bottom surfaces of divot 240 but do not fill divot 240 as shown in FIG. 4.

Figure 5A:
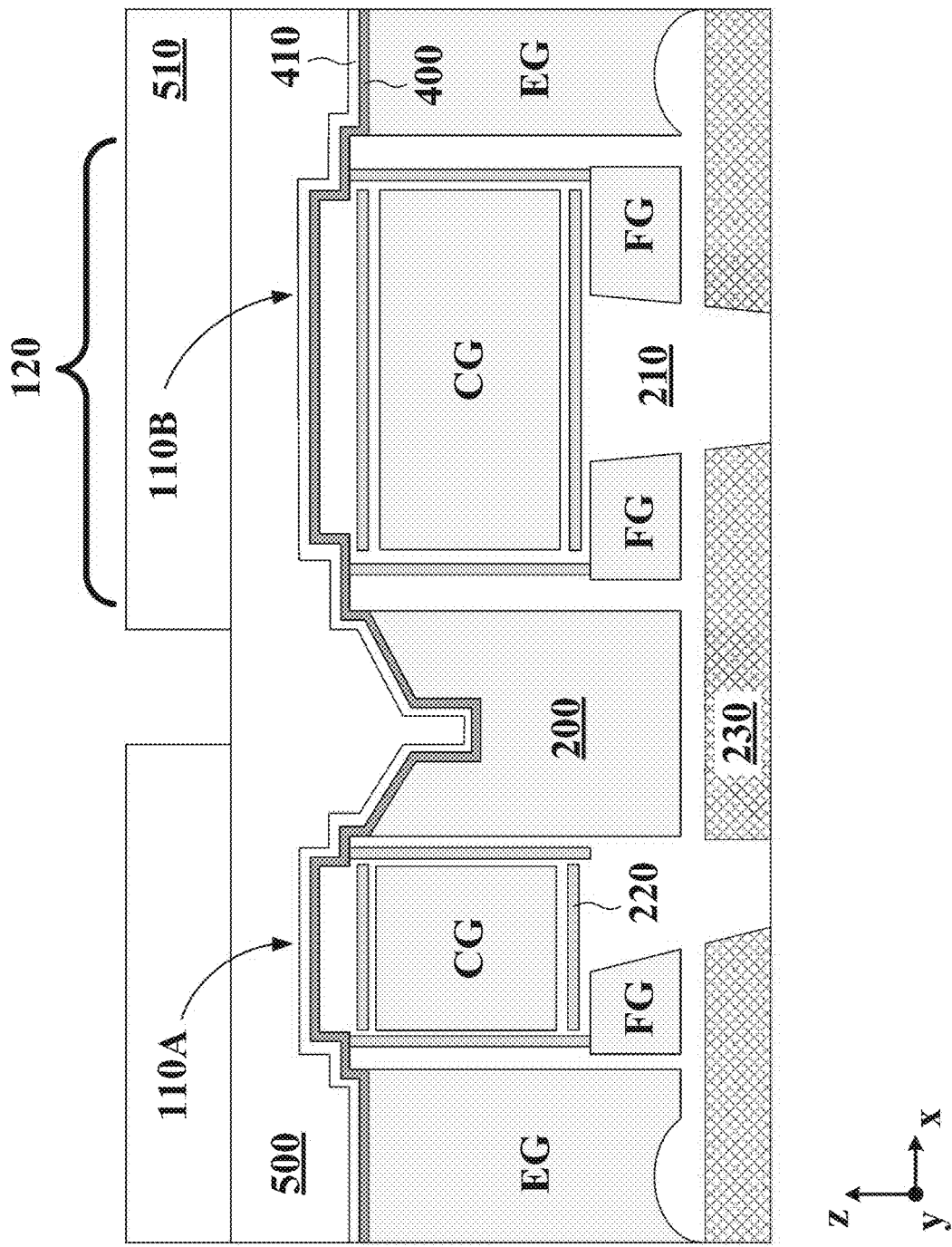
FIGS. 5A, 5B and 5C are cross-sectional views of intermediate structures during a patterning method for the removal of polysilicon material respectively in a strap area of a memory cell, in an area of the memory cell outside the strap region, and in an area outside the memory cell, in accordance with some embodiments.

In referring to FIG. 3, method 300 continues with operation 320 and the process of forming a patterned photoresist layer on nitride layer 410. In some embodiments, prior to the deposition of photoresist layer, a bottom antireflective coating (BARC) layer is interposed between the photoresist layer and nitride layer 410. BARC layer suppresses light reflections during the patterning process of the photoresist layer. Further, the BARC layer minimizes undesirable generation of standing waves during the photoresist patterning process. Standing waves can increase the edge and sidewall roughness of the resulting patterned photoresist structure. In addition, BARC layer forms a flat surface, on which the photoresist layer can be formed, by acting as a filler to fill small imperfections in the underlying layers, such as divot 240. By way of example and not limitation, the BARC layer can be an organic compound that includes carbon, hydrogen, and oxygen. In some embodiments, the BARC layer is spin-coated on gate structures 110A and 110B shown in FIG. 4 at a thickness of about 160 nm. FIG. 5A shows the resulting structure after the formation of BARC layer 500 and patterned photoresist layer 510 on nitride layer 410. In some embodiments, patterned photoresist layer 510 has a thickness of about 120 nm. The aforementioned thicknesses for BARC layer 500 and photoresist layer 510 are not limiting and other thicknesses are within the spirit and the scope of this disclosure.

Figure 5B:
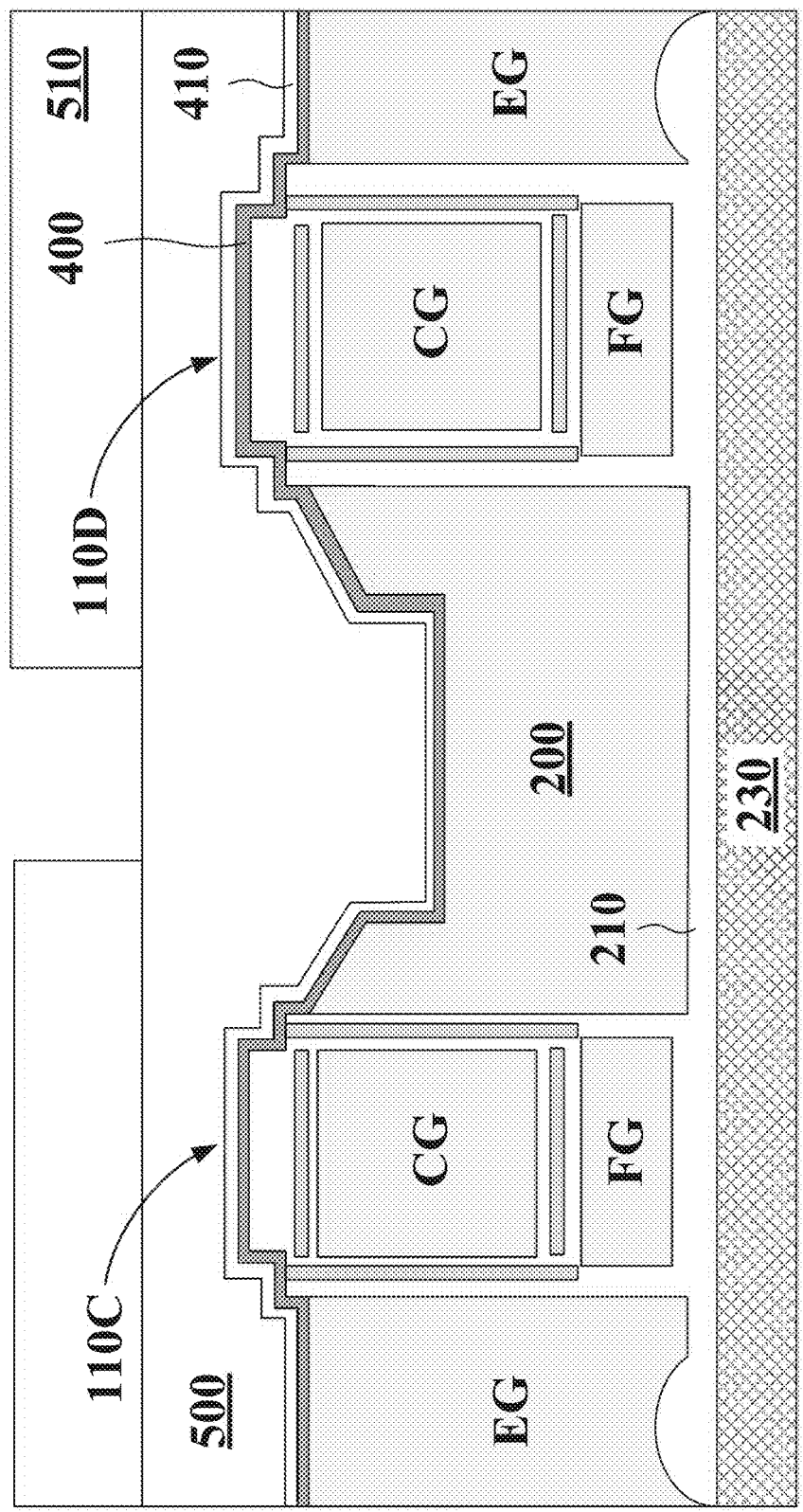
Figure 5C:
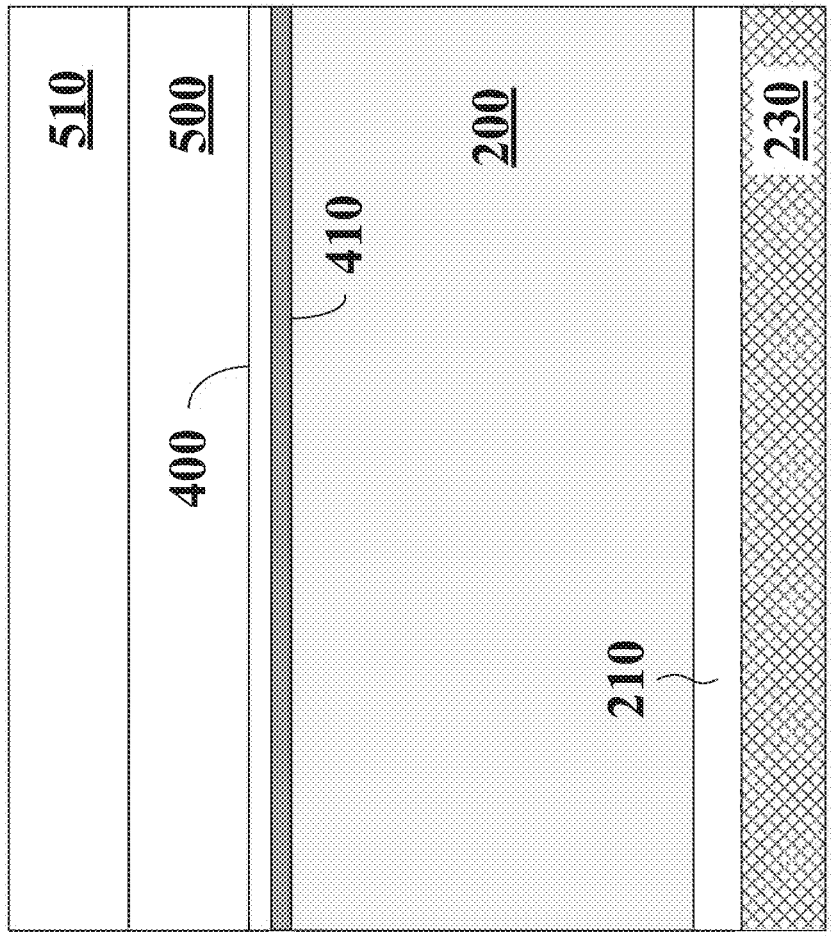

In some embodiments, the formation of oxide layer 400 and nitride layer 410 (as described with respect to operation 310) and the formation of BARC layer 500 and patterned photoresist layer 510 (as described with respect to operation 320) are not exclusive to contact region 120. In other words, the aforementioned oxide, nitride, and photolithography layers (e.g., BARC layer 500 and patterned photoresist layer 510) can be concurrently formed over the entire chip area, including the entire area of the memory cell and the logic areas of the chip. For example, FIG. 5B shows the formation of oxide layer 400, nitride layer 410, BARC layer 500, and patterned photoresist layer 510 according to operations 310 and 320 on the structures shown in FIG. 2B (e.g., an area within the memory cell outside contact region 120). Accordingly, FIG. 5C shows oxide layer 400, nitride layer 410, BARC layer 500, and photoresist layer 510 deposited in a logic area of the chip outside the memory cell. As shown in FIG. 5C, and during operation 320, photoresist layer 510 on the logic area of the chip is not patterned according to sonic embodiments. This is intentional since no features are being formed in the logic area during the subsequent operations.

Figure 6A:
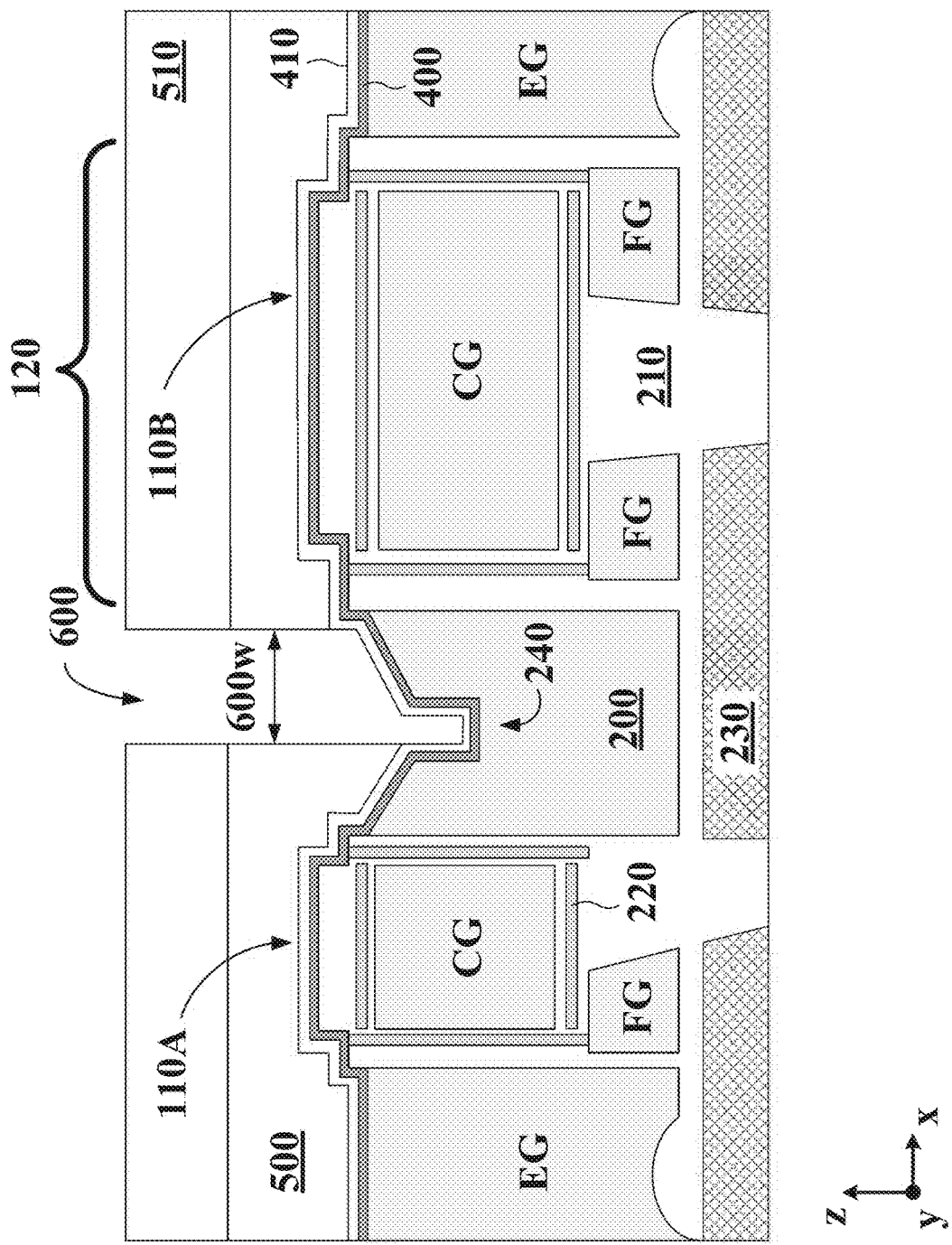
FIGS. 6A and 6B are cross-sectional views of intermediate structures during a patterning method for the removal of polysilicon material respectively in a strap area of a memory cell and in an area of the memory cell outside the strap region.

In referring to FIG. 3, method 300 continues with operation 330 and the process of etching the BARC layer to form opening 600 to expose a portion of nitride layer 220 over polysilicon layer 200 as shown in FIG. 6A. In some embodiments, additional openings (e.g., like opening 600) can concurrently be formed in other locations of the memory cell outside contact region 120—e.g., as shown, for example, in FIG. 6B where opening 600' is formed between gate structures 110C and 110D. In some embodiments, opening 600, as compared to other openings formed outside contact region 120 (e.g., 600'), can have a shorter width 600w along the x-direction due to the limited spacing d' between gate structures 110A and 110B. For example, 600w shown in FIG. 6A (e.g., within contact region 120) can be equal to or less than 600'w (of FIG. 6B) formed in a different area of the memory cell outside contact region 120. Further, opening 600 shown in FIG. 6A exposes a sidewall portion and a bottom surface portion of divot 240 which can be more challenging to etch in a subsequent operation. In contrast, opening 600' in FIG. 6B exposes only a bottom surface portion of divot 240', which can be less challenging to etch in a subsequent operation.

In some embodiments, during the formation of openings 600 and 600' in the memory cell areas, the logic area of the chip remains masked by BARC layer 500 and photoresist layer 510 as shown in FIG. 5C. Consequently, no openings are formed in the logic area of the chip during operation 330 of method 300.

Figure 6B:
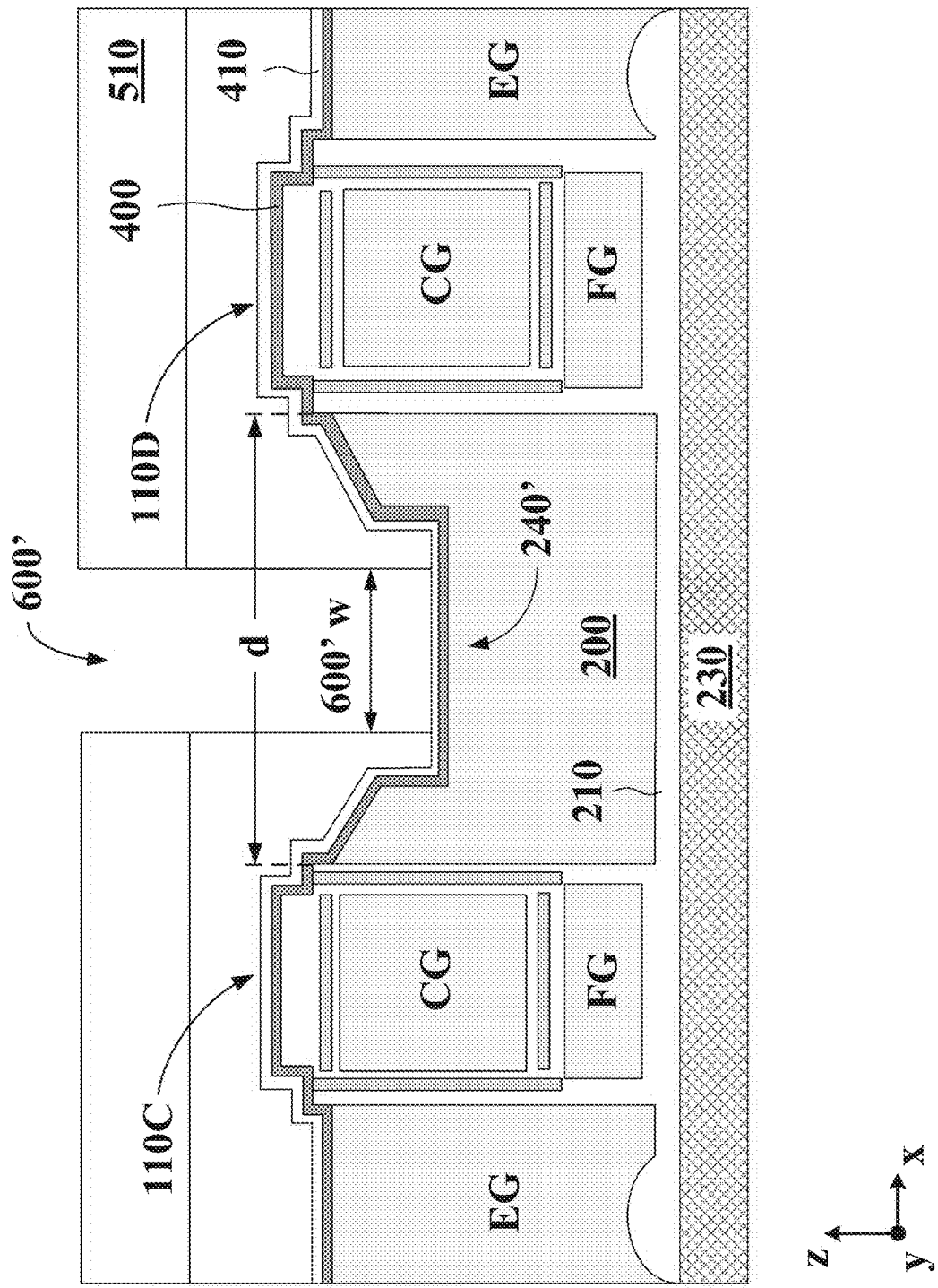
Figure 7A:
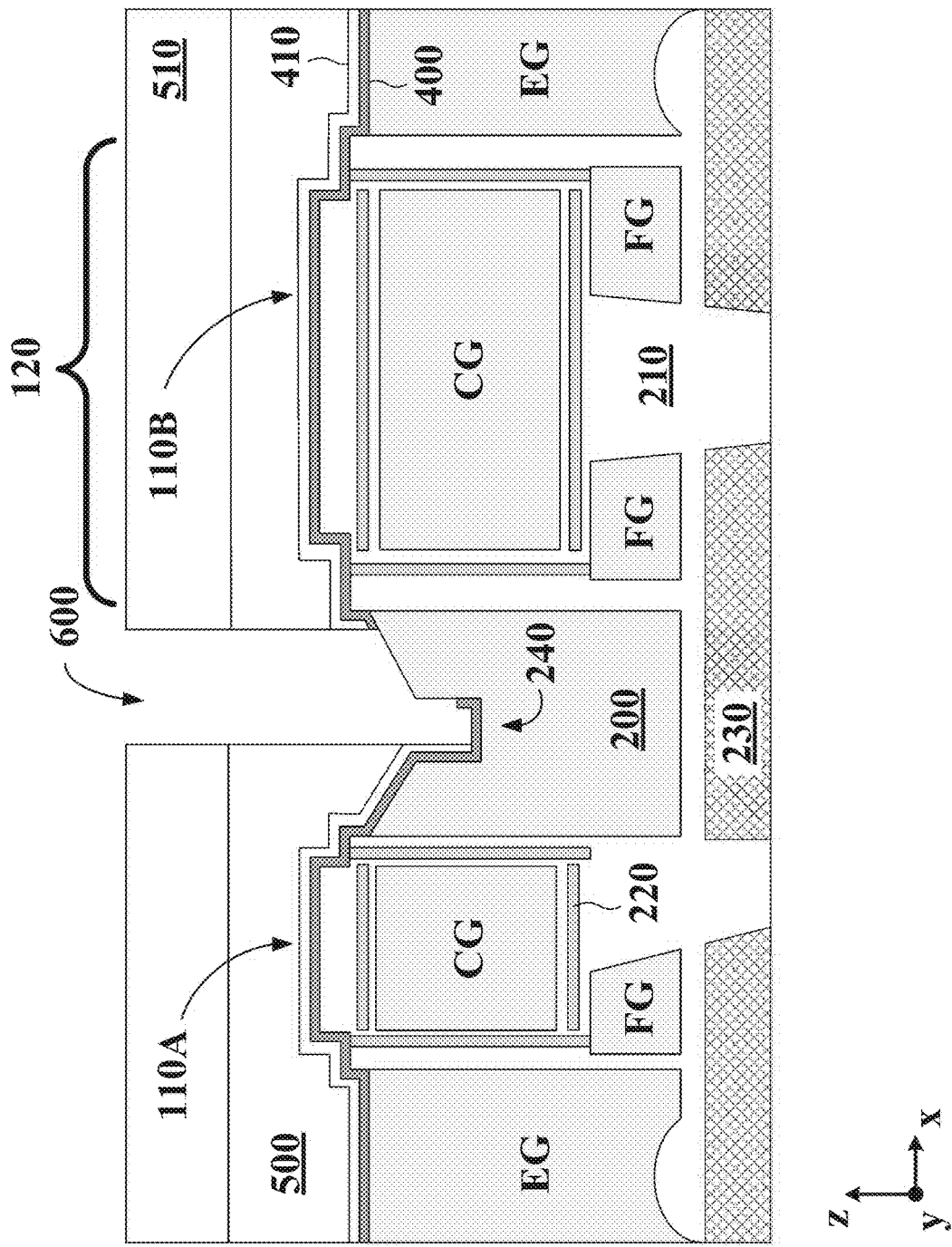
FIGS. 7A and 7B are cross-sectional views of intermediate structures during a patterning method for the removal of polysilicon material respectively in a strap area of a memory cell and in an area of the memory cell outside the strap region.
Figure 7B:
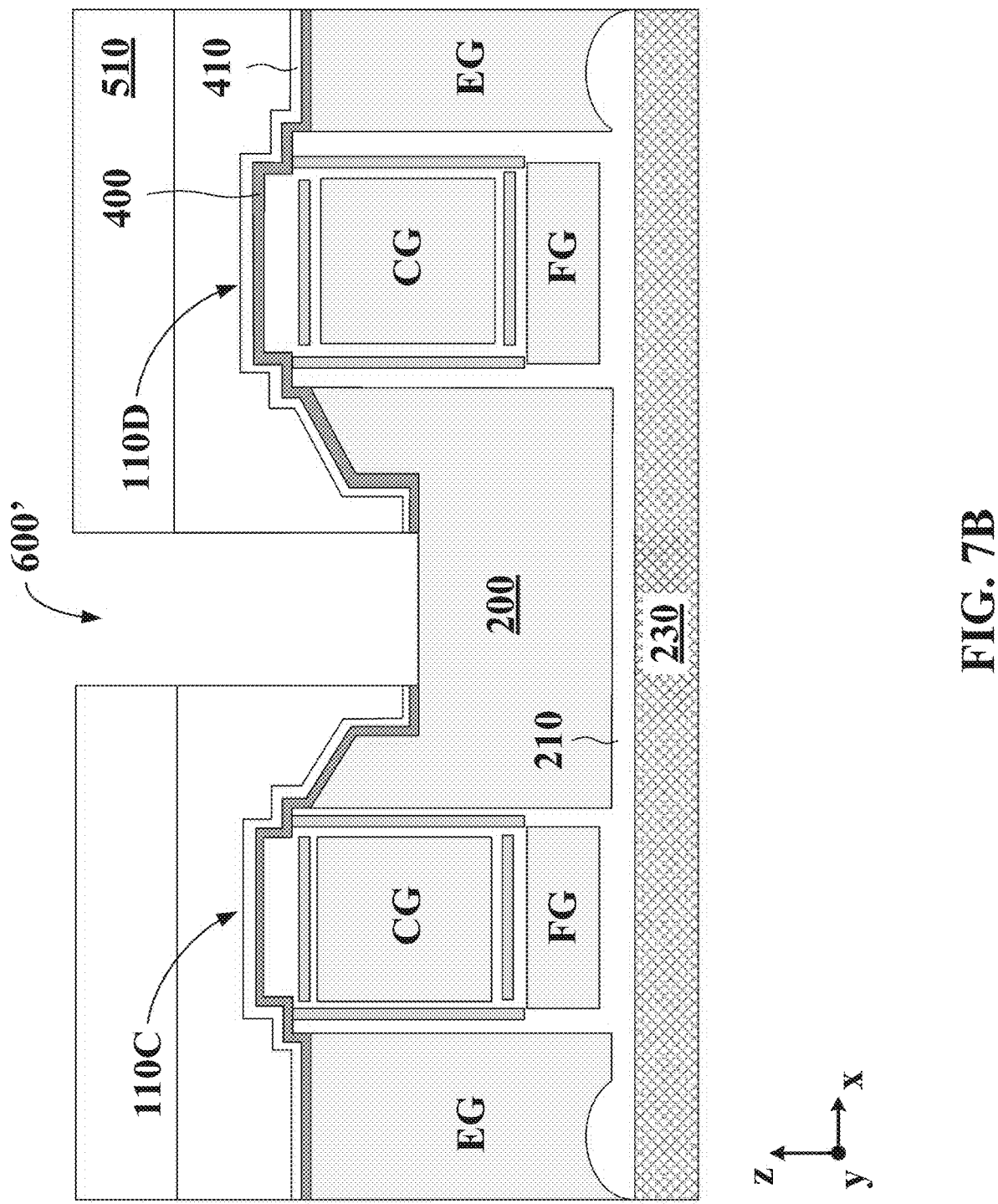

In referring to FIGS. 3 and 7A, method 300 continues with operation 340 and the process of removing, through opening 600, the exposed portion of nitride layer 410 and the underlying oxide layer 400 to expose the polysilicon layer 200 between gate structures 110A and 110B. In some embodiments, during operation 340, exposed portions of nitride layer 410 and oxide layer 400 are also removed in other locations of the memory cell where openings, such as opening 600', have been formed—for example, as shown in FIG. 6B. Contrary to FIG. 6B where opening 600' exposes a portion of a single horizontal surface in divot 240', etching nitride layer 410 and oxide layer 400 near contact region 120 shown in FIG. 7A can be more challenging because opening 600 exposes a combination of vertical and horizontal surfaces in divot 240. In sonic embodiments, etching nitride layer 410 and the underlying oxide layer 400 through opening 600 results in un-etched portions of oxide layer 400 as shown in FIG. 7A. This is undesirable because the presence of residual oxide layer in divot 240 can be detrimental to the subsequent removal of polysilicon layer 200. For example, residual oxide layer in divot 240 can result in polysilicon residue (e.g., un-etched portions of polysilicon layer 200), bridging (e.g., electrical shorts), or combinations thereof. In some embodiments, operation 340 filly removes the exposed portions of nitride layer 410 and the underlying oxide layer 400 through opening 600' in memory cell areas outside contact region 120 as shown in FIG. 7B.

In some embodiments, the etching process used in operation 340 includes a dry etching process optimized to sufficiently remove nitride layer 410 and oxide layer 400 from divot 240. In some embodiments, the etching process includes a mixture of difluoromethane ($CH_2F_2$), sulfur hexafluoride ($SF_6$), helium (He), nitrogen ($N_2$), or the like. In some embodiments, the addition of $N_2$ in the etching chemistry increases the silicon-to-nitride selectivity—for example, from about 1:1 to about 1:6. Consequently, nitride layer 410 is efficiently removed during the etching process and less polysilicon is etched when exposed to the etching chemistry. By way of example and not limitation, the oxide-to-nitride selectivity is about 1:2.

According to some embodiments, the $CH_2F_2$ flow is about 50 sccm, the $SF_6$ flow is about 20 sccm, the He flow is about 100 sccm, and the $N_2$ flow is between about 20 sccm and about 100 sccm. In some embodiments, the duration of the etching process is about 32 s and is based on the silicon-to-nitride and the oxide-to-nitride selectivity. In some embodiments, the duration of the etching process is adjusted so that 80% of exposed oxide layer 400 is removed. In some embodiments, a bias of about 80 Volts is applied to substrate 230 during the etching process. Further, the etching process can be performed at a temperature range between about 40° C. and about 60° C. The aforementioned etching conditions are not limiting and other etching conditions are possible. These other etching conditions are within the spirit and the scope of this disclosure.

According to some embodiments, for a $N_2$ flow below about 20 sccm, the silicon-to-nitride selectivity is poor and polysilicon would be etched along with the nitride. As a result, defects can be formed in polysilicon layer 200. On the other hand, for a $N_2$ flow above about 100 sccm, polymer produced during the etching process can prematurely cease the etching process and nitride is not adequately removed.

Subsequently, photoresist layer 510 and BARC layer 500 are removed with an "ashing" (e.g., a high temperature oxidation process) and gate structures 110A and 110B are subjected to a wet etching process with diluted hydrofluoric acid (DHF) for a duration of about 20 s to ensure that un-etched portions of oxide layer 400 within divot 240 are removed. In some embodiments, the water-to-HF ratio in the aforementioned DHF solution is about 100:1.

Figure 8A:
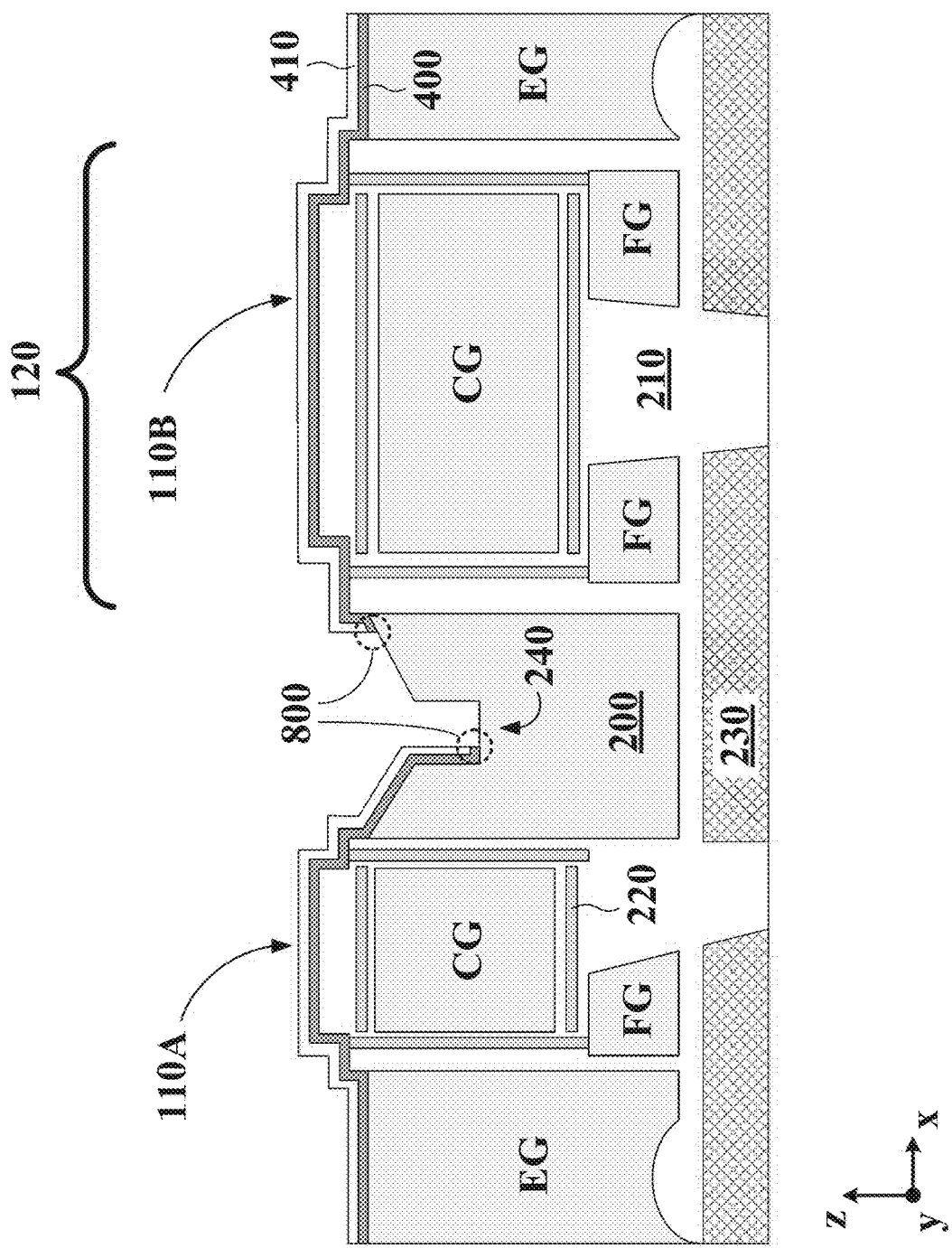
FIGS. 8A, 8B, and 8C are cross-sectional views of intermediate structures during a patterning method for the removal of polysilicon material respectively in a strap area of a memory cell, in an area of the memory cell outside the strap region, and in an area outside the memory cell, in accordance with some embodiments.

During the wet etching process, nitride layer 400 is not etched, and therefore oxide layer 400 "masked" (e.g., covered) by nitride layer 400 (e.g., on gate structures 110A/B and EG) is not removed as shown in FIG. 8A. In some embodiments, exposed edges 800 of oxide layer 400 are laterally recessed (e.g., form an "undercut") due to the etching isotropy of the wet etching process. An undercut in oxide layer 400 can also occur in other locations of the memory cell where edges of oxide layer 400 are exposed below nitride layer 400. The amount of the undercut may be controlled via the dilution ratio of the DHF and the exposure time duration) of the wet etching process. In some embodiments, a similar undercut can be formed in other memory cell areas outside contact region 120 where oxide layer 400 is exposed in the wet etching process as indicated by exposed edges 800' of oxide layer 400 in FIG. 8B.

Figure 8B:
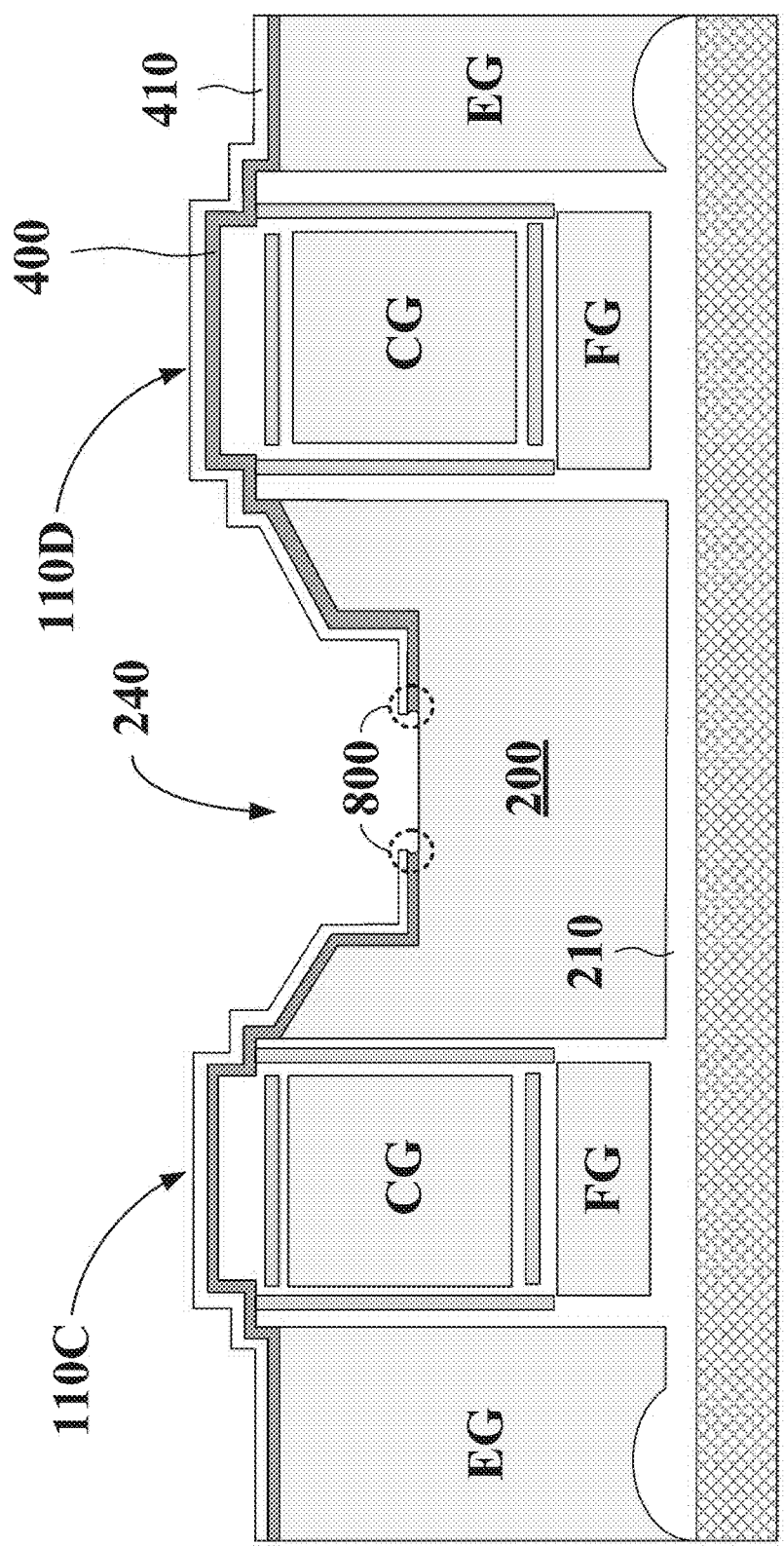
Figure 8C:
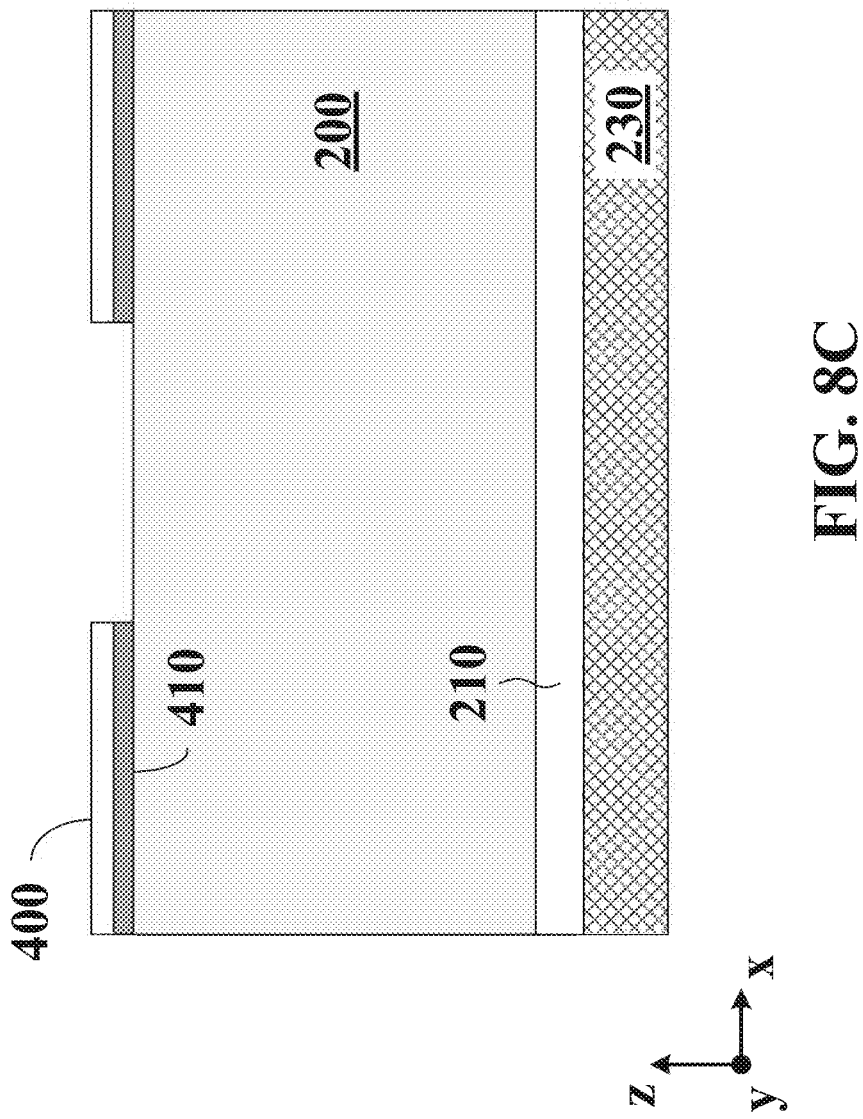

In some embodiments, after operation 340 of method 300 shown in FIG. 3, additional photolithography and etching operations are performed in other areas of the chip (e.g., in the logic area) to remove a portion of nitride layer 410 and oxide layer 400 as shown in FIG. 8C. During these photolithography and etching operations the entire memory cell area is covered by fresh BARC and photoresist layers not shown in FIGS. 8A and 8B. These BARC and photoresist layers are subsequently removed with an aching process prior to operation 350 of method 300 shown in FIG. 3.

Figure 9A:
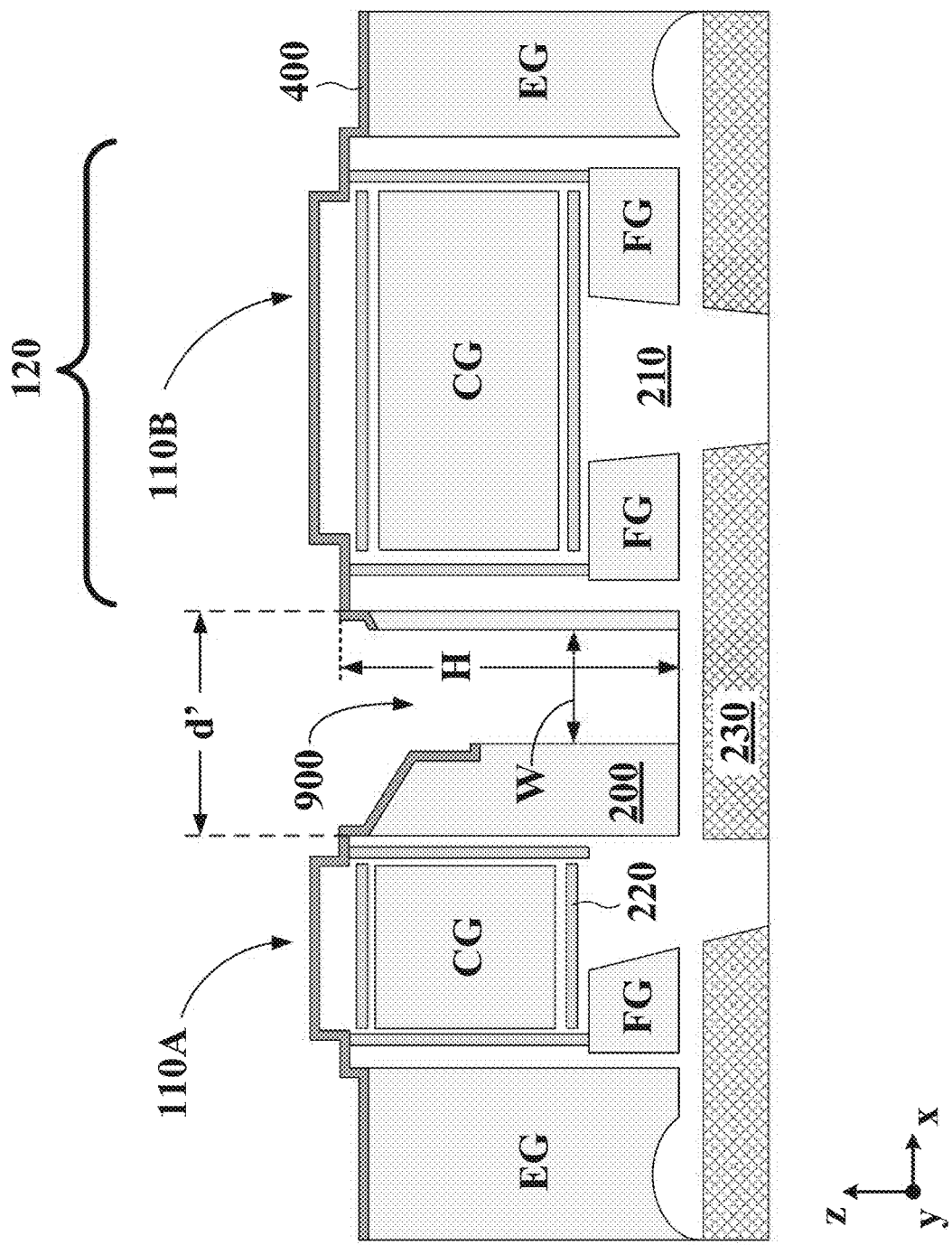
FIGS. 9A, 9B, and 9C are cross-sectional views of intermediate structures during a patterning method for the removal of polysilicon material respectively in a strap area of a memory cell, in an area of the memory cell outside the strap region, and in an area outside the memory cell, in accordance with some embodiments.

In referring to FIG. 3, method 300 continues with operation 350 and the process of etching the exposed polysilicon layer 200 to form a separation or spacing 900 between gate structures 110A and 110B as shown in FIG. 9A. Prior to the polysilicon etch, nitride layer 410 shown in FIGS. 8A and 8B is removed. Removal of nitride layer 410 is achieved, for example, with a dry etching process selective towards nitride layer 410. By way of example and not limitation, the dry etching process can include organofluorine chemistry, such as tetrafluoromethane ($CF_4$) with hydrogen or oxygen, fluoroform ($CHF_3$), 1,1-difluoroethane ($CH_3CHF_2$), or combinations thereof. Other chemistries can also be used and are within the spirit and the scope of this disclosure.

Figure 9B:
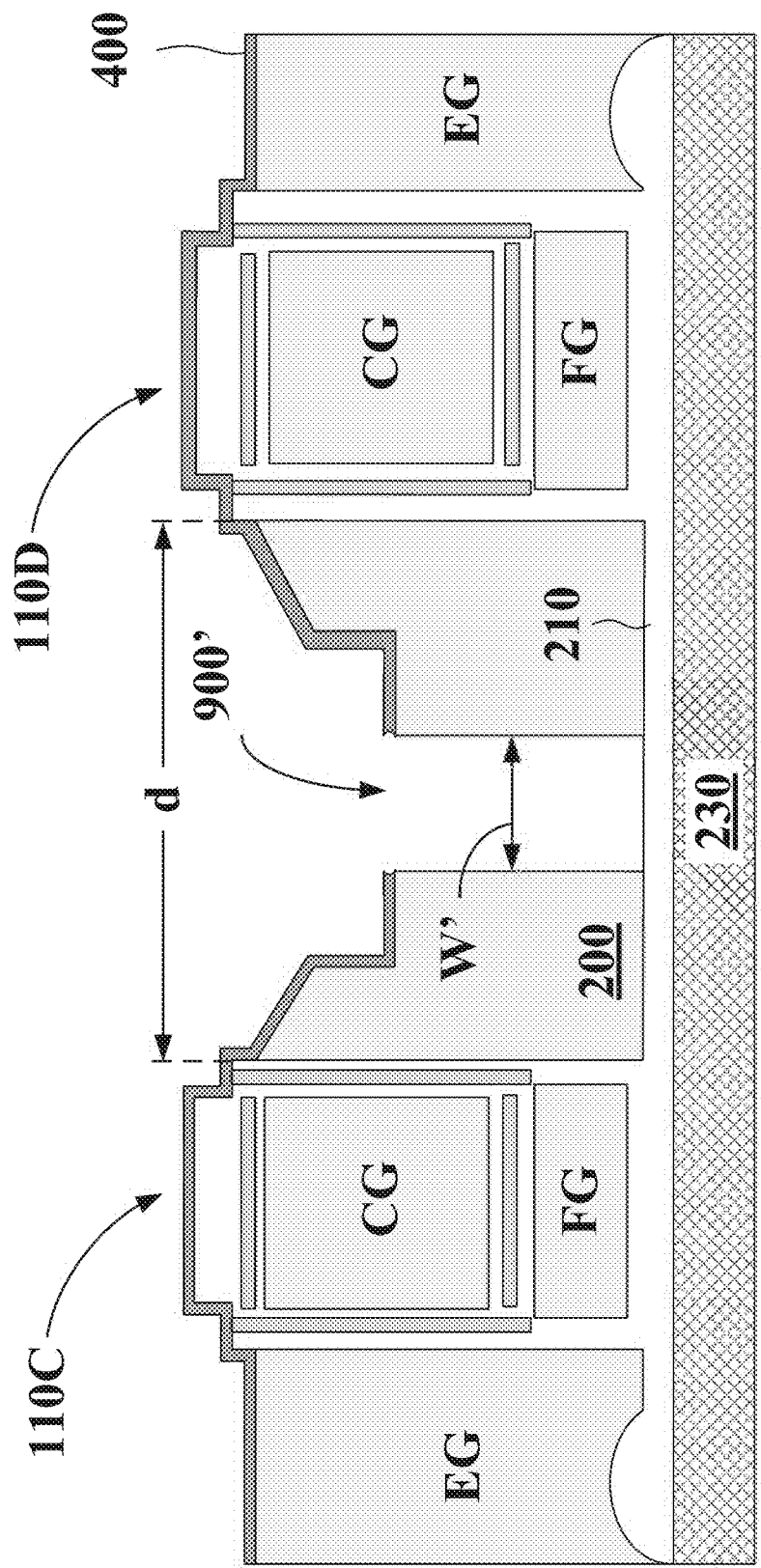

Once nitride layer 410 is removed as shown in FIGS. 9A and 9B, portions of polysilicon layer 200 not masked by oxide layer 400 are removed (e.g., etched) with a dry etching process. In some embodiments, the dry etching process is anisotropic so that lateral etching of polysilicon layer 200 (e.g., in the x-direction) can be controlled. Further, the dry etching process is selective towards polysilicon layer 200. By way of example and not limitation, the dry etching chemistry can have a selectivity between polysilicon layer 200 and oxide layer 400 higher than about 100:1. In some embodiments, the etching chemistry includes a mixture of $CH_2F_2$, $SF_6$, He, $N_2$, and the like. By way of example and not limitation, the $CH_2F_2$ flow can be about 60 sccm, the $SF_6$ flow can be about 45 sccm, the He flow can be about 150 sccm, and the $N_2$ flow can be about 68 sccm. However, the aforementioned conditions are not limiting and other conditions may be used. These other conditions are within the spirit and the scope of this disclosure. In some embodiments, the etching process is end-pointed when dielectric layer 210 below polysilicon layer 200 is exposed through separation or spacing 900.

In some embodiments, separations or spacings 900 and 900' are respectively formed as shown in FIGS. 9A and 9B. By way of example and not limitation, separation or spacing 900 has a width W between about 50 nm and about 100 nm and a height H between about 100 nm and about 120 nm. As shown in FIG. 9A, spacing d' between gate structures 110A and 110B is larger than width W of separation or spacing 900 (e.g., d'>W). Accordingly, spacing d between gate structures 110C and 110D is larger than width W' of separation or spacing 900' (e.g., d>W') as shown in FIG. 9B. In some embodiments, separations or spacings 900 and 900' are formed so that a portion of polysilicon layer 200 remains on the inner sidewalk of gate structure 110A as shown in FIG. 9A and inner sidewalk of gate structures 110C and 110D as shown in FIG. 9B. The aspect ratio of separation or spacing 900 can be, for example, between about 1 and about 2.4.

Figure 9C:
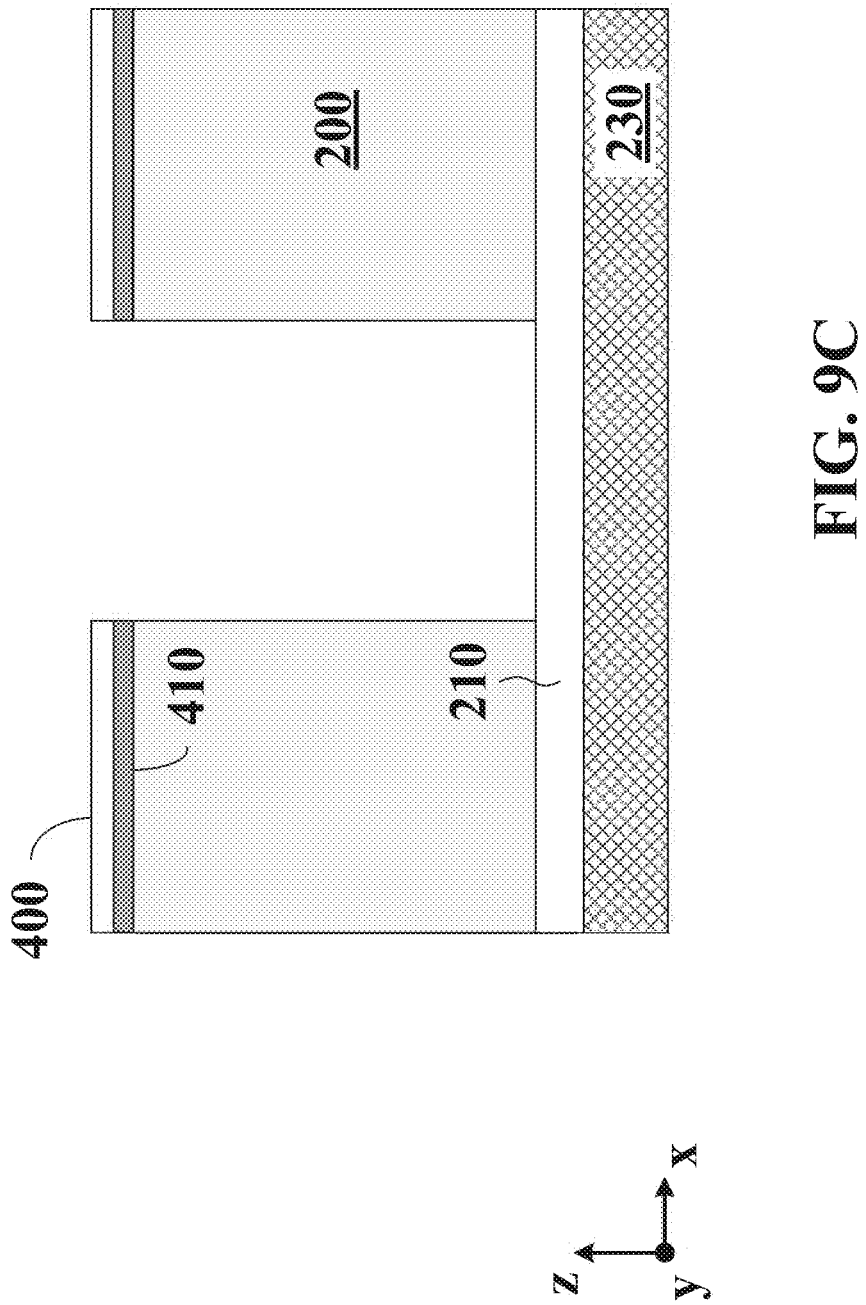

In some embodiments, the polysilicon etching process in operation 350 can form polysilicon openings, including contact openings or other separation openings, in areas of the chip outside the memory cell—e.g., in the logic area of the chip as shown in FIG. 9C.

Figure 10A:
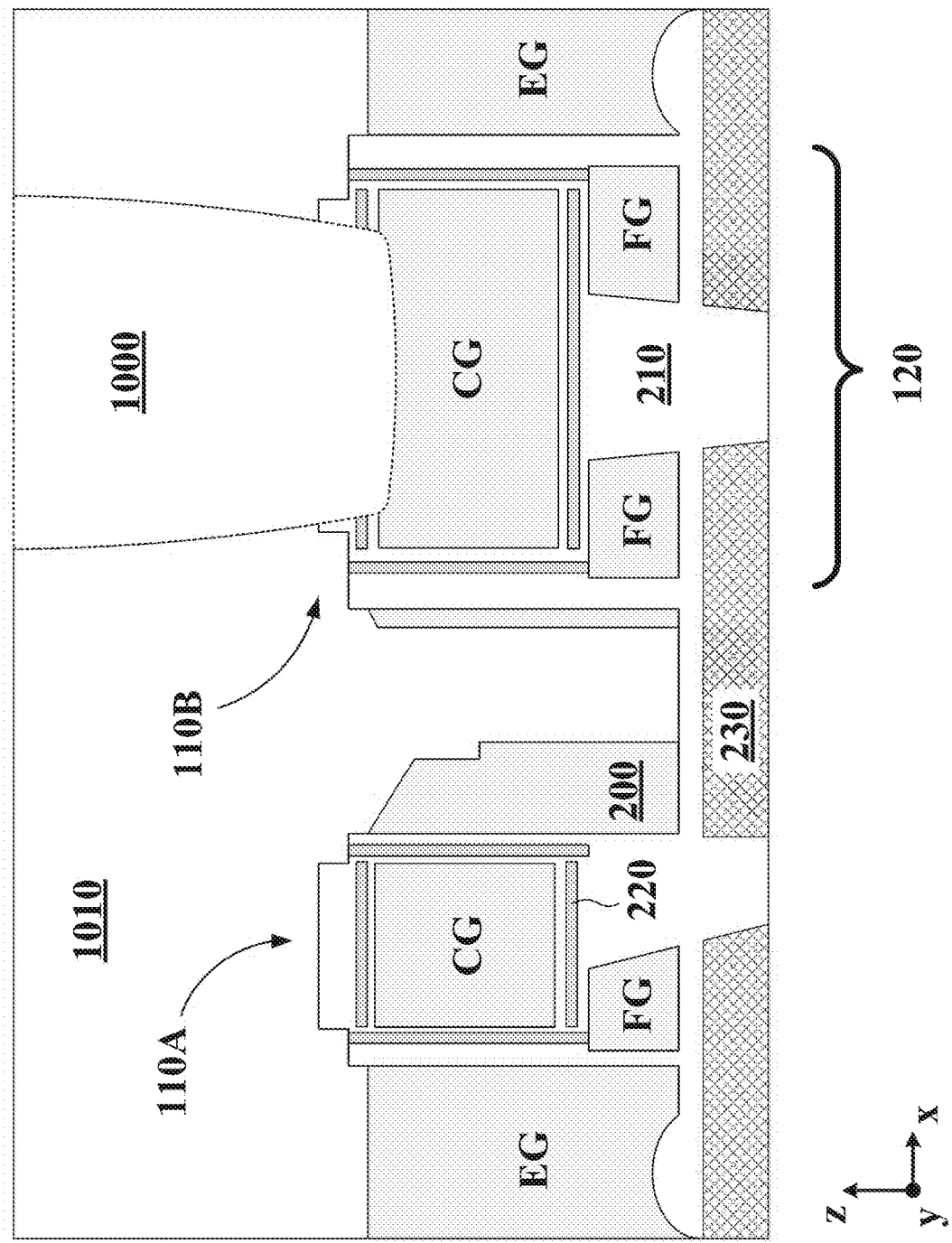
FIG. 10A is a cross-sectional view of a contact formed on a strap region of a memory cell, in accordance with some embodiments.
Figure 10B:
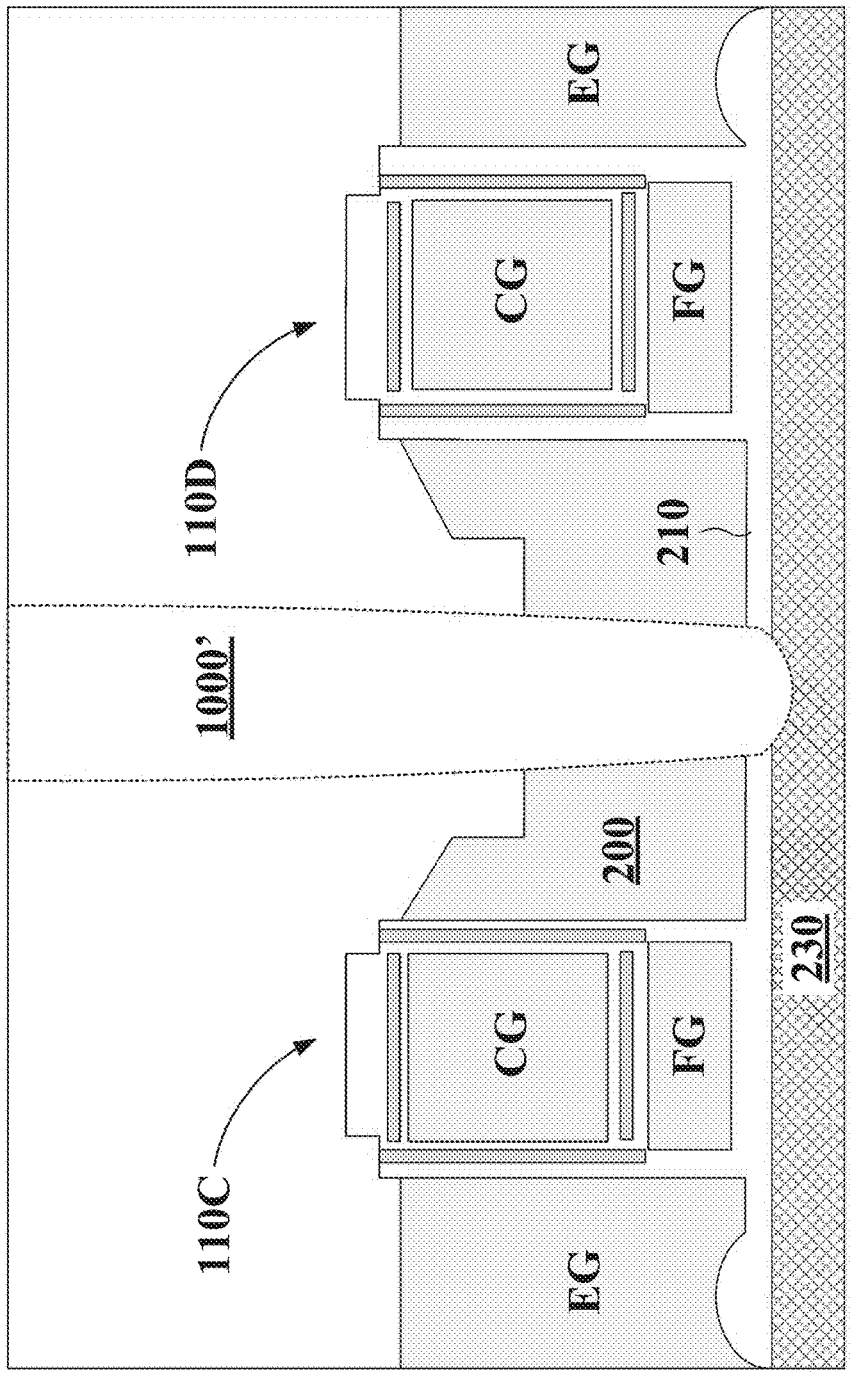
FIG. 10B is a cross-sectional view of a contact formed in an area of a memory cell outside a strap region, in accordance with some embodiments.

In some embodiments, after operation 350, oxide layer 400 is removed—for example, with a wet etching process using DHF—and a contact can be formed on contact region 120 of gate structure 110B. By way of example and not limitation, FIG. 10A shows the structure of FIG. 9A after the formation of a contact 1000 on the widest portion of 110B (e.g., on contact region 120). By way of example and not limitation, contact 1000 can be formed by first depositing a dielectric layer 1010 to surround gate structures 110A/110B and fill separation or spacing 900, followed by a patterning process that forms a contact opening in dielectric layer 1010 on contact region 120 of gate structure 110B. The contact opening can be subsequently filled with a conductive material, such as a metal (e.g., tungsten (W), cobalt (Co), and the like). In some embodiments, an etch stop layer, not shown in FIG. 10, can be deposited on gate structures 110A/110B and separation or spacing 900 prior to the formation of dielectric layer 1010 to facilitate the formation of the contact opening for contact 1000. Formation of additional contacts on other portions of the memory cell, or other regions of the chip, is possible during the formation of contact 1000. For example, a contact 1000' can be formed between gate structures 110C and 110D shown in FIG. 10B. Subsequently, metallization or wiring layers can be formed over gate structures 110A, 110B, 110C, and 110D. These additional metallization or wiring layers, which are not shown in FIGS. 10A and 10B, can be electrically coupled through contacts 1000 and 1000' to the CG of gate structure 110B and source drain regions of substrate 230.

Various embodiments in accordance with this disclosure describe a patterning process for the strap region of a memory cell that removes excess material between polysilicon lines and reduces (or eliminates) residue left behind by the removal process. In some embodiments, the residue removal (or elimination) accomplished by introducing photolithography and etching operations that facilitate the removal process of excess material between tightly spaced polysilicon lines. In some embodiments, the patterning process includes a hard mask photolithography and hard mask etching processes that remove the hard mask layers from divots in a polysilicon layers between polysilicon lines. In some embodiments, the etching process includes a dry etching process that targets nitride and oxide layers of the hard mask followed by a wet etching process that targets oxide layer of the hard mask.

In some embodiments, a method includes forming, on a substrate, a first polysilicon line with a first width and a second polysilicon line with a second width, where the first and second polysilicon lines are spaced apart by a polysilicon layer and each of the first and second polysilicon lines includes a contact region wider than the first and second widths. The method further includes depositing a mask layer on the first polysilicon line, the contact region of the second polysilicon line, and the polysilicon layer; and etching, from the polysilicon layer, the mask layer with a dry etching process to remove a portion of the mask layer and to expose a first portion of the polysilicon layer. Further, etching, from the polysilicon layer, unremoved portions of the mask layer with a wet etching process to expose a second portion of the polysilicon layer that is larger than the first portion, where the second portion is narrower than the polysilicon layer which is interposed between the contact region of the second polysilicon line and the first polysilicon line. The method also includes removing the exposed second portion of the polysilicon layer to form a separation between the contact region of the second polysilicon line and the first polysilicon line.

In some embodiments, a method includes depositing a first hard mask layer in a divot formed on a top portion of a polysilicon layer which is interposed between a first polysilicon gate structure and a second polysilicon gate structure; and depositing a second hard mask layer on the first hard mask layer, where the first and second hard mask layers cover sidewall and bottom surfaces of the divot. The method also includes performing a first etch to remove the second hard mask layer and a portion of the first hard mask layer from a first sidewall of the divot; performing a second etch to remove the second hard mask layer from the first sidewall and from a bottom surface of the divot; and performing a third etch to remove the polysilicon layer not covered by the first and second hard mask layers to form a separation between the first polysilicon gate structure and the second polysilicon structure.

In some embodiments, a structure includes a first polysilicon line and a second polysilicon line parallel to each other disposed on a substrate. The first and second polysilicon lines include a contact region and a non-contact region, where each contact region is wider than each non-contact region and where the contact region of the first polysilicon line is offset with respect to the contact region of the second polysilicon line. The structure further includes a polysilicon layer that is disposed on a sidewall of a non-contact region of the first polysilicon line and is opposite to the contact region of the second polysilicon line, and a space between the polysilicon layer and the contact region of the second polysilicon line. The structure also includes a contact disposed on the contact region of the second polysilicon line.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A structure, comprising:
a substrate;
a first polysilicon line and a second polysilicon line parallel to each other disposed on the substrate with each of the first and second polysilicon lines comprising a contact region and a non-contact region, wherein each contact region is wider than each non-contact region and wherein the contact region of the first polysilicon line is offset with respect to the contact region of the second polysilicon line;
a polysilicon layer disposed on a sidewall of the non-contact region of the first polysilicon line and opposite to the contact region of the second polysilicon line;
a space between the polysilicon layer and the contact region of the second polysilicon line; and
a contact disposed on the contact region of the second polysilicon line.

2. The structure of claim 1, wherein the space has an aspect ratio between about 1 and about 2.4.

3. The structure of claim 1, wherein a dielectric layer is disposed in the space and a bottom surface of the space is polysilicon layer free.

4. The structure of claim 1, wherein the contact region of the second polysilicon line comprises a control gate and one or more floating gates.

5. The structure of claim 4, wherein the contact is in contact with the control gate.

6. The structure of claim 4, further comprising a nitride layer isolating the control gate from the one or more floating gates.

7. The structure of claim 1, wherein an offset distance between adjacent contact regions of the first and second polysilicon lines is greater than a spacing between the contact region of the second polysilicon line and the non-contact region of the first polysilicon line.

8. A semiconductor device, comprising:
a dielectric layer on a substrate;
first and second gate structures on the dielectric layer, wherein each of the first and second gate structures comprises a non-contact region and a contact region wider than the non-contact region, and wherein the contact region of the first gate structure is adjacent to the non-contact region of the second gate structure;
a polysilicon layer disposed on a sidewall of the non-contact region of the first gate structure; and
a dielectric structure on the dielectric layer and between the polysilicon layer and the contact region of the second gate structure.

9. The semiconductor device of claim 8, wherein the dielectric structure has an aspect ratio between about 1 and about 2.4.

10. The semiconductor device of claim 8, wherein the dielectric structure is in contact with the dielectric layer to separate the first gate structure from the contact region of the second gate structure.

11. The semiconductor device of claim 8, wherein the contact region of the second gate structure comprises a control gate above the dielectric layer and one or more floating gates between the control gate and the dielectric layer.

12. The semiconductor device of claim 11, further comprising an erase gate adjacent to the control gate and the one or more floating gates.

13. The semiconductor device of claim 11, further comprising a contact disposed on the contact region of the second gate structure, wherein the contact is in contact with the control gate.

14. The semiconductor device of claim 11, further comprising a nitride layer between the control gate and the one or more floating gates.

15. A semiconductor structure, comprising:
a dielectric layer on a substrate;
a first polysilicon line comprising a first contact region and a first non-contact region on the dielectric layer;
a second polysilicon line parallel to the first polysilicon line and on the dielectric layer, wherein the second polysilicon line comprises a second contact region and a second non-contact region, and wherein the second contact region is opposite to the first non-contact region;
a first polysilicon layer disposed on a sidewall of the first non-contact region;
a second polysilicon layer disposed on a sidewall of the second contact region; and
a dielectric structure on the dielectric layer and between the first and second polysilicon layers.

16. The semiconductor structure of claim 15, wherein the dielectric structure is in contact with the dielectric layer and separates the first polysilicon layer from the second polysilicon layer.

17. The semiconductor structure of claim 15, wherein the second contact region of the second polysilicon line comprises a control gate and one or more floating gates on the dielectric layer.

18. The semiconductor structure of claim 17, further comprising a contact disposed on the second contact region of the second polysilicon line, wherein the contact is in contact with the control gate.

19. The semiconductor structure of claim 17, further comprising a nitride layer separating the control gate from the one or more floating gates.

20. The semiconductor structure of claim 17, further comprising an erase gate adjacent to the control gate and the one or more floating gates.

* * * * *